United States Patent
Yilmaz et al.

(10) Patent No.: US 9,748,375 B2
(45) Date of Patent: Aug. 29, 2017

(54) NANO MOSFET WITH TRENCH BOTTOM OXIDE SHIELDED AND THIRD DIMENSIONAL P-BODY CONTACT

(71) Applicant: Alpha and Omega Semiconductor Incorporated

(72) Inventors: Hamza Yilmaz, Saratoga, CA (US); Daniel Ng, Campbell, CA (US); Daniel Calafut, San Jose, CA (US); Madhur Bobde, San Jose, CA (US); Anup Bhalla, Princeton Junction, NJ (US); Ji Pan, San Jose, CA (US); Yeeheng Lee, San Jose, CA (US); Jongoh Kim, Suwon (KR)

(73) Assignee: ALPHA AND OMEGA SEMICONDUCTOR INCORPORATED, Sunnyvale, CA (US)

( * ) Notice: Subject to any disclaimer, the term of this patent is extended or adjusted under 35 U.S.C. 154(b) by 0 days.

(21) Appl. No.: 15/061,901

(22) Filed: Mar. 4, 2016

(65) Prior Publication Data
US 2016/0190309 A1    Jun. 30, 2016

Related U.S. Application Data

(60) Continuation of application No. 14/329,751, filed on Jul. 11, 2014, now Pat. No. 9,281,394, which is a
(Continued)

(51) Int. Cl.
*H01L 29/78* (2006.01)
*H01L 29/40* (2006.01)
(Continued)

(52) U.S. Cl.
CPC ........ *H01L 29/7813* (2013.01); *H01L 27/088* (2013.01); *H01L 29/0626* (2013.01);
(Continued)

(58) Field of Classification Search
None
See application file for complete search history.

(56) References Cited

U.S. PATENT DOCUMENTS 5,186,331 A    2/1993   Valster
6,140,678 A   10/2000  Grabowski et al.
(Continued)

OTHER PUBLICATIONS

Non-Final Office Action for U.S. Appl. No. 14/329,751, dated Jul. 2, 2015.
(Continued)

*Primary Examiner* — Benjamin Sandvik
(74) *Attorney, Agent, or Firm* — JDI Patent; Joshua D. Isenberg

(57) ABSTRACT

A semiconductor power device may include a lightly doped layer formed on a heavily doped layer. One or more devices are formed in the lightly doped layer. Each device may include a body region, a source region, and one or more gate electrodes formed in corresponding trenches in the lightly doped region. Each of the trenches has a depth in a first dimension, a width in a second dimension and a length in a third dimension. The body region is of opposite conductivity type to the lightly and heavily doped layers. The source region is formed proximate the upper surface. One or more deep contacts are formed at one or more locations along the third dimension proximate one or more of the trenches. The contacts extend in the first direction from the upper surface into the lightly doped layer and are in electrical contact with the source region.

9 Claims, 49 Drawing Sheets

Related U.S. Application Data division of application No. 13/364,948, filed on Feb. 2, 2012, now Pat. No. 8,785,278.

(51) Int. Cl.

| | |
|---|---|
| *H01L 29/66* | (2006.01) |
| *H01L 29/08* | (2006.01) |
| *H01L 29/10* | (2006.01) |
| *H01L 27/088* | (2006.01) |
| *H01L 21/265* | (2006.01) |
| *H01L 29/417* | (2006.01) |
| *H01L 29/423* | (2006.01) |
| *H01L 29/45* | (2006.01) |
| *H01L 29/06* | (2006.01) |

(52) U.S. Cl.
CPC ........ *H01L 29/086* (2013.01); *H01L 29/0865* (2013.01); *H01L 29/1095* (2013.01); *H01L 29/404* (2013.01); *H01L 29/407* (2013.01); *H01L 29/4236* (2013.01); *H01L 29/66727* (2013.01); *H01L 29/66734* (2013.01); *H01L 29/7811* (2013.01); *H01L 21/26586* (2013.01); *H01L 29/0623* (2013.01); *H01L 29/0869* (2013.01); *H01L 29/41766* (2013.01); *H01L 29/42368* (2013.01); *H01L 29/456* (2013.01)

(56) References Cited

U.S. PATENT DOCUMENTS

| | | | |
|---|---|---|---|
| 6,359,306 | B1 | 3/2002 | Ninomiya |
| 6,429,481 | B1 | 8/2002 | Mo et al. |
| 7,265,415 | B2 | 9/2007 | Shenoy et al. |
| 8,785,278 | B2 | 7/2014 | Yilmaz et al. |
| 9,281,394 | B2 | 3/2016 | Yilmaz et al. |
| 2004/0195618 | A1 | 10/2004 | Saito et al. |
| 2005/0029585 | A1 | 2/2005 | He et al. |
| 2006/0267090 | A1 | 11/2006 | Sapp et al. |
| 2009/0065814 | A1* | 3/2009 | Bhalla ................ H01L 29/1083 257/230 |
| 2009/0236612 | A1* | 9/2009 | Nakamura ............ H01L 21/046 257/77 |
| 2010/0155830 | A1 | 6/2010 | Takahashi |
| 2013/0200451 | A1 | 8/2013 | Yilmaz et al. |

OTHER PUBLICATIONS

Final Office Action for U.S. Appl. No. 13/364,948, dated Nov. 26, 2013.

Non-Final Rejection for U.S. Appl. No. 13/364,948, dated Aug. 2, 2013.

\* cited by examiner

Cross section along line X-X'

Cross section along line A-A'

Cross section along line A-A'

NANO MOSFET WITH TRENCH BOTTOM OXIDE SHIELDED AND THIRD DIMENSIONAL P-BODY CONTACT

CLAIM OF PRIORITY

This Application is a continuation of commonly-assigned U.S. patent application Ser. No. 14/329,751, filed Jul. 11, 2014, the entire contents of which are incorporated herein by reference. U.S. patent application Ser. No. 14/329,751 is a divisional of commonly-assigned U.S. patent application Ser. No. 13/364,948, filed Feb. 2, 2012, the entire contents of which are incorporated herein by reference.

FIELD OF THE INVENTION

This invention relates in general to semiconductor power field effect transistor devices and in particular relates to new configurations and methods for manufacturing improved nano trench Metal-Oxide Semiconductor Field Effect Transistor (MOSFET) devices.

BACKGROUND OF THE INVENTIONS

Nowadays, trench-type MOSFET devices are broadly used as power witches in electronic appliance. The difference between the trench-type MOSFET device and the traditional MOSFET device is that the gate structure of the former is formed in a trench to minimize the area of the MOSFET device, thereby enhancing the density of the MOSFET device and reducing the on-resistance. However, thinning the gate oxide layer to enhance the current drive renders the gate oxide layer more easily affected by the punch-through effect.

Conventional technologies to configure and manufacture high voltage semiconductor power devices are still confronted with difficulties and limitations to further improve the performances due to different tradeoffs. In the vertical semiconductor power devices such as trench-type MOSFET device, there is a tradeoff between the drain to source resistance, i.e., on-state resistance, commonly represented by $R_{ds}A$ (i.e., $R_{ds}$ X Active Area) as a performance characteristic, and the breakdown voltage sustainable of the power device.

Several device configurations have been explored in order to resolve the difficulties and limitations caused by these performance tradeoffs. It is also known that a thick bottom oxide is desirable at the bottom of the trench in order to avoid gate oxide damage during breakdown process. Also, having a thick bottom oxide lowers the gate to drain capacitance. In this approach, a silicon dioxide layer is grown on the exposed silicon at the bottom of the trench. This growth is typically performed using thermal oxidation. However, a drawback of such a technique is that thermal oxidation increases the thermal budget required in the process.

Conventional shielded gate trench (SGT) MOSFET structure also lower reversed transfer capacitance $C_{rss}$, which equals to the MOSFET gate-to-drain capacitance $C_{gd}$. Shielded gate trench MOSFETs are preferred for certain applications over conventional MOSFETs and conventional trench MOSFETs because they provide several advantageous characteristics. Shielded gate trench MOSFETs exhibit reduced gate-to-drain capacitance $C_{gd}$, reduced on-resistance $R_{DSon}$, and increased breakdown voltage of the transistor. For conventional trench MOSFETs, the placement of many trenches in a channel, while decreasing the on-resistance, also increases the overall gate-to-drain capacitance $C_{gd}$. Introducing a shielded gate trench MOSFET structure remedies this issue by shielding the gate from the electric field in the drift region with a shield electrode tied to the source potential, thereby substantially reducing the gate-to-drain capacitance. The shielded gate trench MOSFET structure also provides the added benefit of a higher majority carrier concentration in the drift region that improves the device's breakdown voltage and hence lower on-resistance. However, the SGT MOSFET structure presents challenges in forming the dielectric isolation between the shield electrode and gate electrode, unclamped inductive switching (UIS) challenges, and thick shield oxide requirement to optimize breakdown voltage.

Another conventional technique to improve the breakdown voltage and lower the gate to drain capacitance around the trench bottom is forming thick bottom oxide in the trench gate and floating P-dopant islands under the trench gate to improve the electrical field shape. The charge compensation of the P-dopant in the floating islands enables the increasing the N-epitaxial doping concentration, thus reduce the RdsA. In addition, the thick bottom oxide in the trench gate lowers the gate to drain coupling, thus lower the gate to drain charge $Q_{gd}$. The device further has the advantage to support a higher breakdown voltage on both the top epitaxial layer and the lower layer near the floating islands. However, the presence of floating P region causes higher dynamic on resistance during switching. In addition, high density Trench MOSFET requires self align contact which is a challenging process. Furthermore, even use of a self aligned contact structure limits the cell pitch around 0.8-0.85 µm.

U.S. Pat. No. 5,168,331 to Hamza Yilmaz discloses a metal-oxide-semiconductor field effect transistor (MOSFET) constructed in a trench or groove configuration provided with protection against voltage breakdown by the formation of a shield region adjacent to the insulating layer which borders the gate of the transistor. The shield region is either more lightly doped than, or has a conductivity opposite to, that of the region in which it is formed, normally the drift or drain region, and it is formed adjacent to a corner on the boundary between the insulating layer and the drift or drain region, where voltage breakdown is most likely to occur.

U.S. Pat. No. 7,265,415 to Shenoy et al. discloses a trench MOS-gated transistor that includes a first region of a first conductivity type forming a P-N junction with a well region of a second conductivity type. The well region has a flat bottom portion and a portion extending deeper than the flat bottom portion. A gate trench extends into the well region. Channel regions extend in the well region along outer sidewalls of the gate trench. The gate trench has a first bottom portion which terminates within the first region, and a second bottom portion which terminates within the deeper portion of the well region such that when the transistor is in an on state the deeper portion of the well region prevents a current from flowing through those channel region portions located directly above the deeper portion of the well region.

U.S. Pat. No. 6,359,306 to Hideaki Ninomiya discloses a trench-MOS gate structure device that includes a first conductivity-type base layer; a second conductivity-type base layer formed on the first conductivity-type layer; a first conductivity-type source layer formed on the second conductivity-type base layer; a plurality of first trenches parallel to each other and penetrating through the first conductivity-type source layer and the second conductivity-type base layer and ending in the first conductivity-type base layer. One gate electrode is formed in each trench. A plurality of second trenches penetrate through the first conductivity-type source layer and end in the second conductivity-type base layer with a main electrode formed in each trench. Portions of the second trenches and portions of the first conductivity-type source layer are alternatively arranged in regions between the first trenches. This trench-MOS gate structure device will enable high packing density thus low specific on resistance (specific on resistance=Die Area times on resistance of the die), however this structure will be extremely fragile as soon as device goes into avalanche breakdown. In addition, built-in parasitic NPN Bipolar Junction Transistor (BJT) will be triggered to turn on locally showing a negative resistance. This effect is sometimes referred to as the Bipolar transistor snap back phenomenon. The parasitic NPN BJT is most likely triggered first in a smaller area of the chip causing hugging of all the current to the smaller area thus destruction of the device by excessive localized heating.

It is within this context that embodiments of the present invention arise.

BRIEF DESCRIPTION OF THE DRAWINGS

Other objects and advantages of the invention will become apparent upon reading the following detailed description and upon reference to the accompanying drawings in which.

DESCRIPTION OF THE SPECIFIC EMBODIMENTS

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1A:
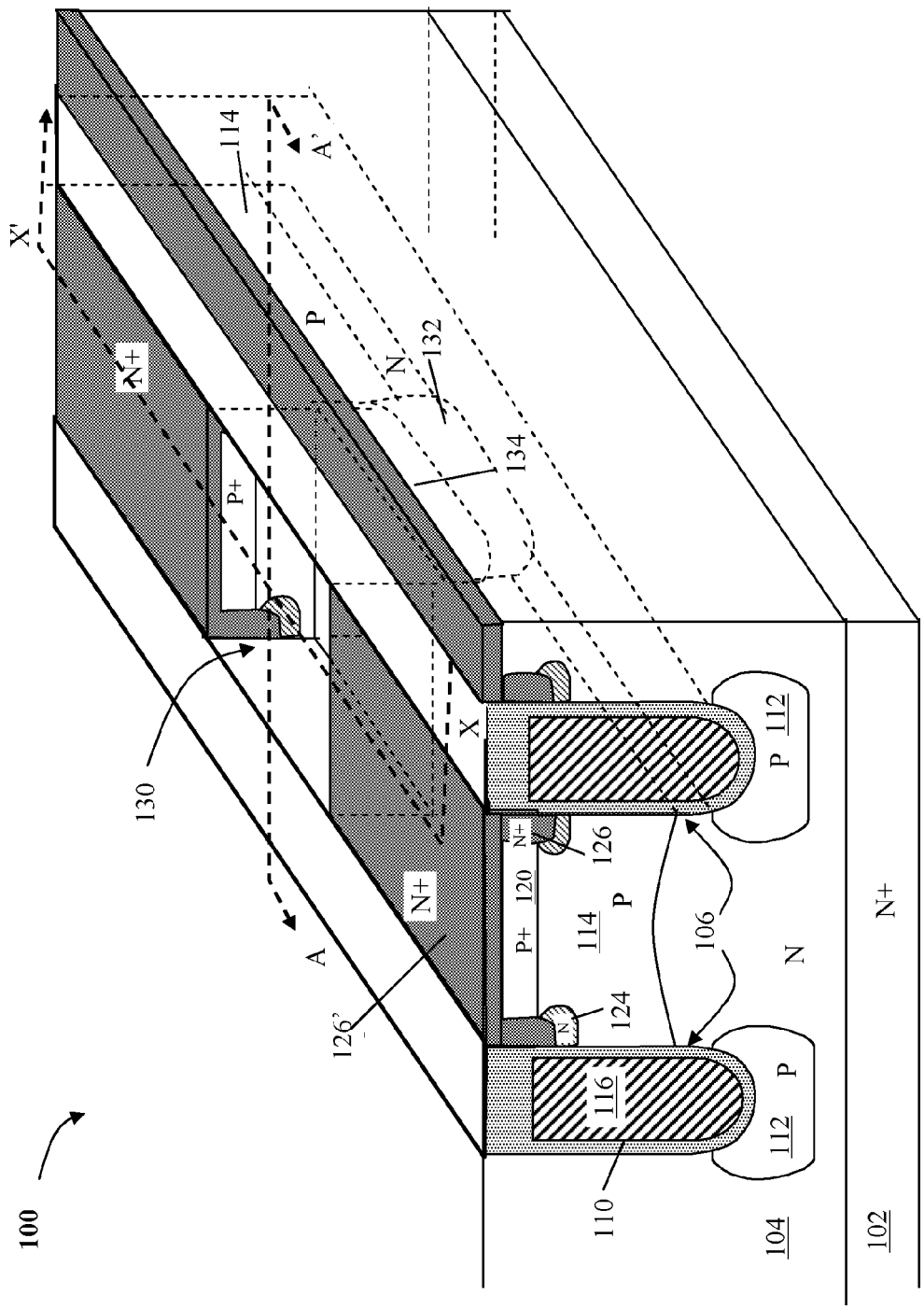
FIG. 1A is a three-dimensional view of a nano-MOSFET with third dimensional deep P+ contact and deep P implant according to a first embodiment of the present invention.

Embodiments of the present invention resolve aforementioned problems by implementation of a deep P implant at the bottom of the gate trench and a third dimensional deep P+ contact. The third dimensional deep P+ contact facilitates sustaining high breakdown voltage while achieving low gate drain capacitance $C_{gd}$ or reversed transfer capacitance $C_{rss}$. The deep P+ region in third dimension forms a voltage clamp diode with lower avalanche breakdown than that of parasitic NPN BJT of the MOSFET cells. These deep P+ regions form "clamp diodes" repeated with a certain periodicity to prevent parasitic NPN BJT of the MOSFET going into avalanche BV thus avoid destruction of the device in the real world applications. FIG. 1A is a three-dimensional view of a nano-MOSFET with third dimensional deep P+ contact and deep P implant according to a first embodiment of the present invention. The device 100 is generally formed on a semiconductor substrate 104 of the first type dopant, for example N-type, a lower portion 102 of which is heavily doped with the first type to act as a drain. A body region 114 doped of a second type opposite to the first type, for example P-type, is formed near a surface of the substrate 104. A plurality of gate trenches 106 are formed in parallel in the substrate through the body region 104. For simplicity FIG. 1A only shows two gate trenches forming a semiconductor mesa there between. The trenches 106 are lined with an insulating material 110, e.g., an oxide, with a gate electrode 116 of a conductive material formed inside each trench. A source region disposed in a top portion of the semiconductor mesa along the direction parallel to the length of the trenches, includes a heavily doped regions 126 formed in the body region 114 at or near the surface of the substrate and on top of a lightly doped source region 124 along a sidewall of the gate trench to ensure that the source region extends underneath the gate electrode, which is described later, for proper MOSFET operation, and a top surface heavily doped region 126' extending between the sidewalls of the trenches that is much shallower than the heavily doped regions 126. The lightly doped source region 124 laterally extends to a space away from the trench side wall further than the heavily doped source region 126 disposed atop of the lightly doped source region 124. The source region is doped opposite the body region 114, but the heavily doped source regions 126 and 126' are more heavily doped than the drain region. A body contact region 120 is disposed and extending between the source regions 126 under the top surface heavily doped region 126' and forming junctions there between. By way of example, the body contact region 120 may be formed by P+ implant that is more heavily doped than the body region 114. In one embodiment, the body contact region 120 extends in a lateral space greater than a space between two adjacent lightly doped source regions 124 disposed below a bottom of the body contact region 120 in the semiconductor mesa. In one embodiment, the heavily doped source region 126 extends from the top surface of the semiconductor mesa along the side wall of the gate trench down to a depth deeper than the bottom of the body contact region 120 and connects to the lightly doped source region 124. The source region encapsulates the body contact region 120 on the top surface of the mesa and along the side walls of the trenches.

For an N-type substrate, a deep P shield implant region 112 is formed at the bottom of each gate trench 106 for shielding the gate electrode 116. The shield implant regions 112 extending to a width wider than the gate trench surrounds the bottom of gate trench having a top edge spaced apart from the bottom of the body region 114. The gate electrode is electrically insulated from the semiconductor substrate 104 by the insulating material 110 in the trench 106. Another insulating material electrically isolates the gate electrode from the source metal (not shown). A top surface of the gate electrode 116 may be recessed below the level of an upper surface of the substrate 104. In any case, the top surface of the gate electrode 116 should extend above a bottom of the lightly doped source region 124 and preferably above a bottom of the heavily doped source region 126.

A plurality of openings 130 extending from the top surface of semiconductor mesa penetrate through at least the source region 126' into the semiconductor mesa are disposed alongside with the gate trenches. Preferably the plurality of openings 130 are disposed periodically along the length of the semiconductor mesa and each opening extends across the entire width of the semiconductor mesa. The openings disposed on adjacent mesas are preferably interleaved with each other. A third dimensional deep heavily doped contact 134 is disposed in each of the openings 130. Preferably the third dimensional deep heavily doped contacts 134 may extend the entire width of the semiconductor mesa down to a depth substantially the same as the bottom of the less heavily doped body region 114, or slightly exceeding below the body region 114, to pin the device breakdown at these third dimensional deep heavily doped contacts 134. For simplicity only one such opening 130 is shown in FIG. 1A. The opening 130 is further filled with a conductive material (not shown) to electrically connecting the third dimensional deep heavily doped contact 134 to the source region and a source metal (not shown) disposed on top of the device. The device 100 also includes a deep P implant region 132 below the third dimensional deep P+ contact formed at each opening 130 such that the deep P implant region 132 extending below the body region 114 at least partially intersects the deep P shield implant region 112 therefore electrically connecting the deep P shield implant region 112 to the source through the third dimensional deep heavily doped contact. In one preferred embodiment, the bottom of deep P implant region is shallower than the bottom of the gate trenches.

Figure 1B:
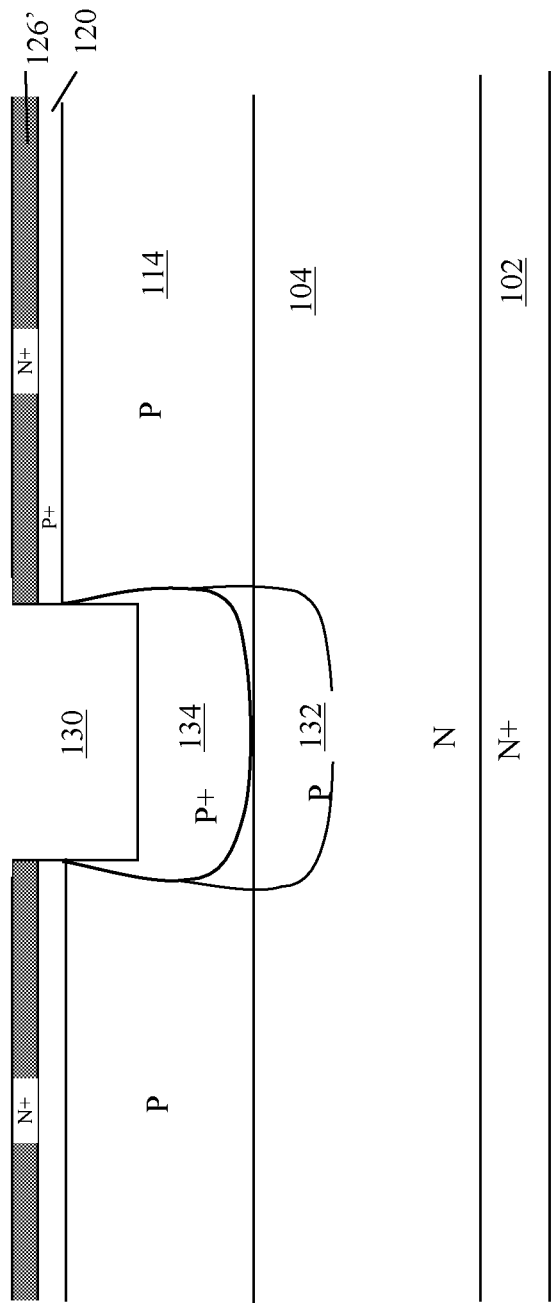
FIG. 1B is a cross-sectional view of the nano-MOSFET of FIG. 1A along line X-X' of FIG. 1A.
Figure 1C:
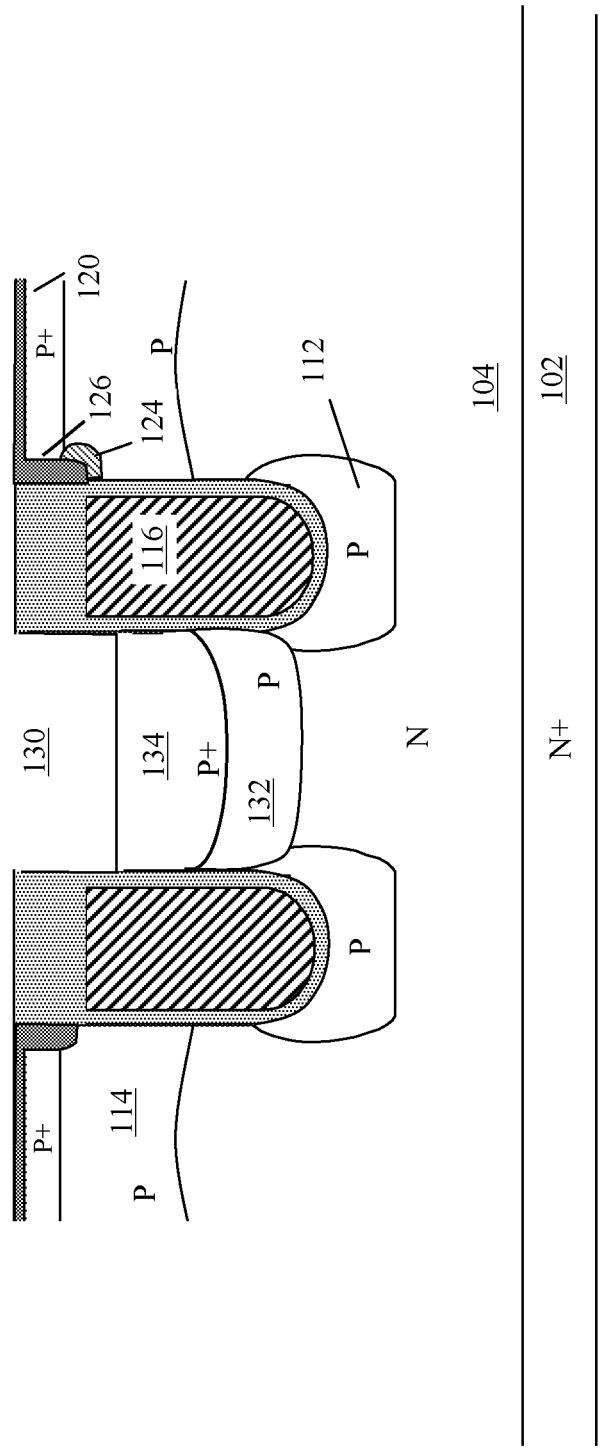
FIG. 1C is a cross-sectional view of the nano-MOSFET of FIG. 1A along line A-A' of FIG. 1A.

FIG. 1B is a cross-sectional view of the device 100 along line X-X' and FIG. 1C is a cross-sectional view of the device 100 along line A-A'. The opening 130 is firstly formed in a third dimension in the mesa between two gate trenches 106 extending across the entire width of the mesa through the source region 126' and body contact layer 120 to a depth that is shallower than the bottom of body region 114. In one embodiment the depth of the opening 130 extends below the top surface of gate electrode. A P type implantation at a high energy through the opening 130 is carried out to form deep P implant region 132 followed by a low energy and heavy concentration P type implantation to form P+ contact region 134 on top of the deep implant region 132, such that the P+ contact region 134 is in contact with the deep P shield implant region 112 at the bottom of the trenches 106 via the deep P implant region 132. In one preferred embodiment, the heavily doped P+ contact region 134 extends from the bottom of opening 130 down to a depth into the epi layer 104 below the bottom of P body region 114. In another preferred embodiment, the heavily doped P+ contact region 134 has a bottom shallower than that of the gate trench bottom. In yet another embodiment, the deep P implant region 132 extends to a depth deeper than the bottom of gate trenches. In yet another embodiment, the deep P implant region 132 extends to a depth shallower than a bottom of the deep P shield implant region 112. As shown in FIG. 1C, the shield implant regions 112 extending a width wider than the trench surrounds the bottom of gate trench having a top edge on one side of the trench spaced apart from the bottom of the body region 114 and another top edge on the other side of the trench intersects with the deep P implant region 132.

The device structure of the present invention includes one or more deep P+ contacts in the third dimension as shown in FIG. 1A enables the cell pitch to be reduced in half, e.g., to 0.4 μm pitch. Furthermore, the third dimensional deep P+ contact can localize the breakdown and improves the breakdown voltage capability of the device 100. The deep P shield implant region 112 located at the bottom of the trench gate 106 shields the gate electrode 116 inside the trench and also connects to source potential via the P+ contact region 134 and the deep P implant region 132, thus also acts as a source shield, as such $C_{rss}$ is reduced. The doping dosage of the shield implant regions 112 can be configured to balance charge between the shield regions and nearby portions of the substrate region 104.

Figure 2A:
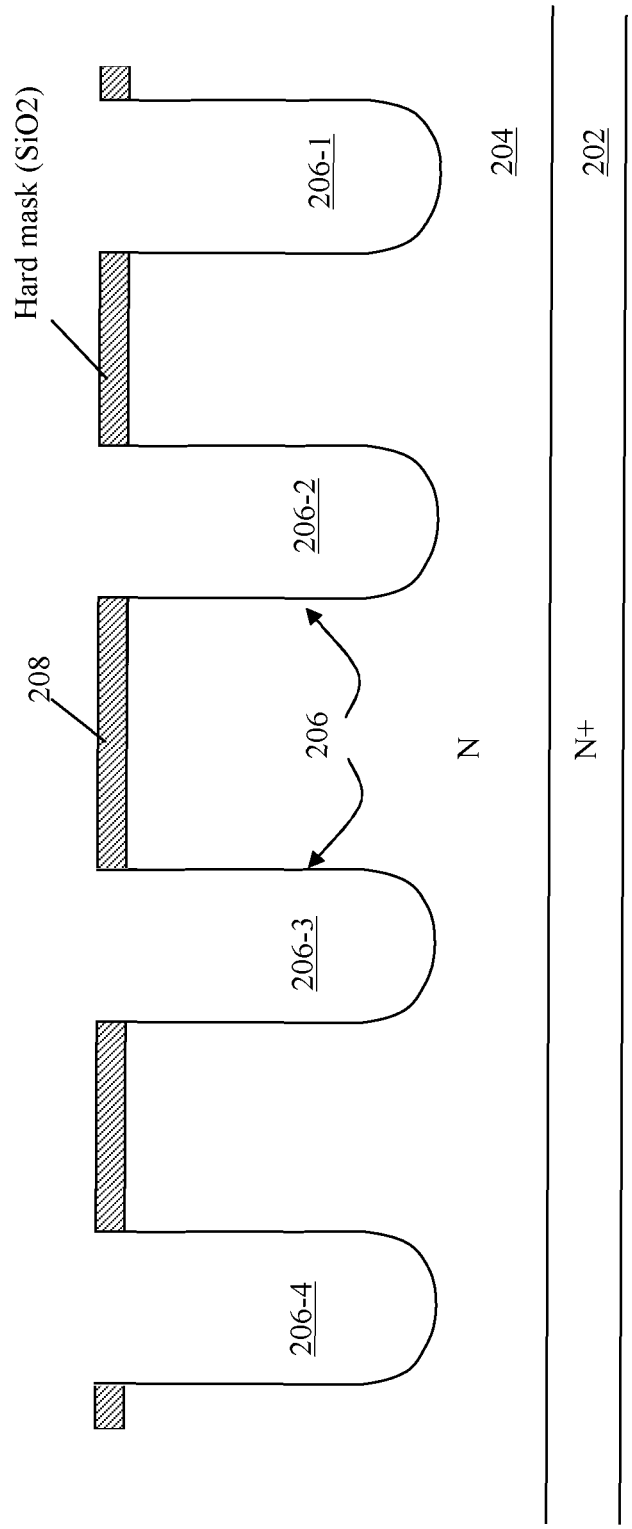
FIGS. 2A-2P are a sequence of cross-sectional schematic diagrams taken along line B-B' of FIG. 1A illustrating a method of fabrication the nano-MOSFET with third dimensional deep P+ contact of the type depicted in FIG. 1A.
Figure 2B:
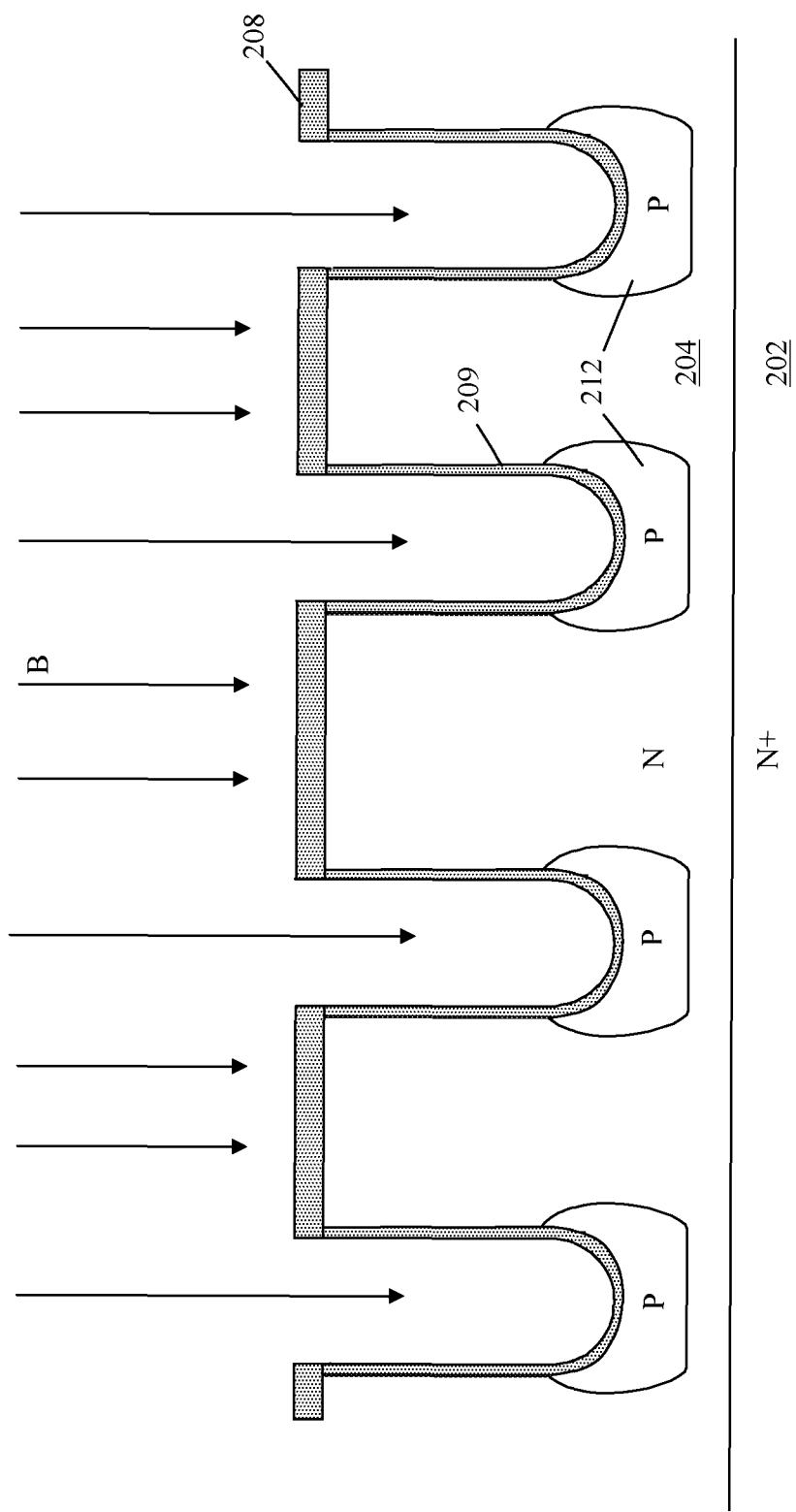

FIGS. 2A-2O are cross-sectional diagrams illustrating a process of making the nano-MOSFET device shown in FIG. 1A. As seen in FIG. 2A, the process may begin by forming an initial layer of insulator, e.g., oxide 208, on the N-type semiconductor substrate 204, a lower portion 202 of which is heavily doped with the N-dopant to act as a drain. A first photoresist (not shown), which is a trench mask, may be formed on the oxide 208 and then developed followed by patterning the oxide 208 to form the openings in the oxide 208. The trench mask is removed and gate trenches 206, including gate contact trench 206-1, dummy gate trench 206-2, active gate trenches 206-3 and 206-4 which are all interconnected in a third dimension, may then be etched in the semiconductor substrate 204 through the openings in the oxide 208. Additional active gate trenches are usually formed to provide MOSFET cells in stripe layout. As shown in FIG. 2B, liner insulator 209 (e.g., another oxide) may then be formed on exposed portions of the substrate 204 including side and bottom walls of the gate trenches 206. P type dopant, such as Boron, is implanted at a high energy of about 30 keV to 200 keV to form shield implant regions 212 at the bottom of the trenches 206. The shield implant regions 212 extending a width wider than the gate trench surrounds the bottom of gate trench. The hard mask 208 blocks the implantation into the top surface of the mesa during the implantation process.

Figure 2C:
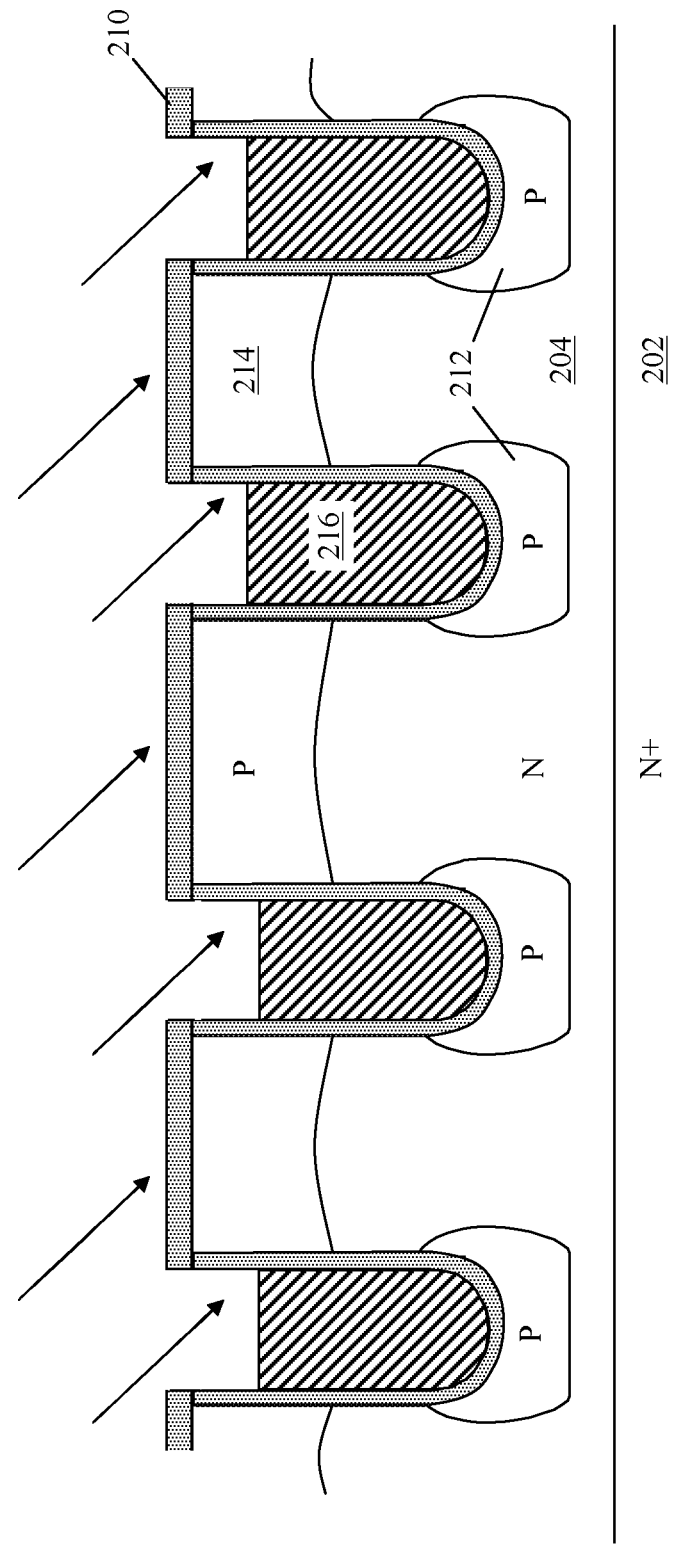

As shown in FIG. 2C, the oxide layer 209 and the hard mask 208 are then removed followed by the growth of gate oxide 210 on exposed portions of the substrate 204 including side and bottom walls of the gate trenches 206. For a low voltage device, the thickness of the gate oxide 210 is in a range of 50 Å to 500 Å. Conductive material, such as polysilicon with heavily doped N-type, is deposited inside the trenches 206 to form gate electrode 216, which is then etched back to a predetermined depth below the top surface of the substrate 204. P-type dopant is angled implanted into the top portions of the substrate 204 to form P-body region 214 with polysilicon gate electrodes 216 inside the trenches 206 acting as a reference for P-body implant. The P-type dopant is preferably implanted at a dose of 5e12 $cm^{-2}$ to 1e14 $cm^{-2}$ with an energy of 30 keV to 100 keV. A bottom of P body region 214 space away and above the shield implant regions 212.

Figure 2D:
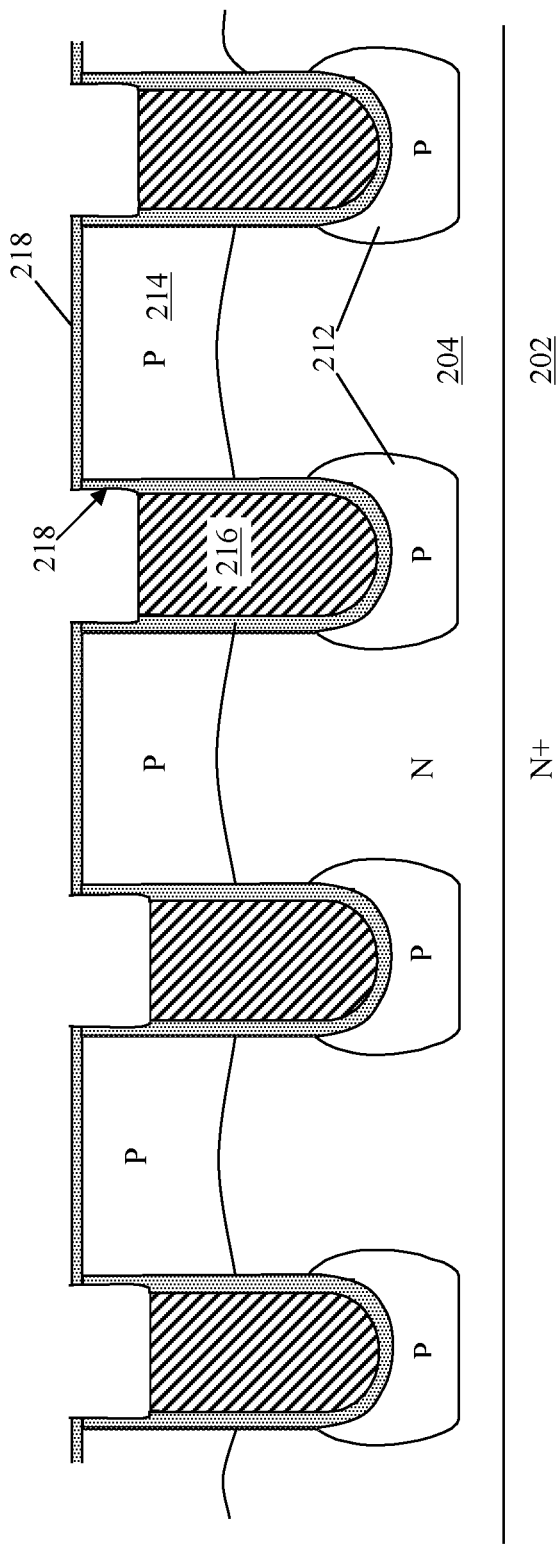
Figure 2E:
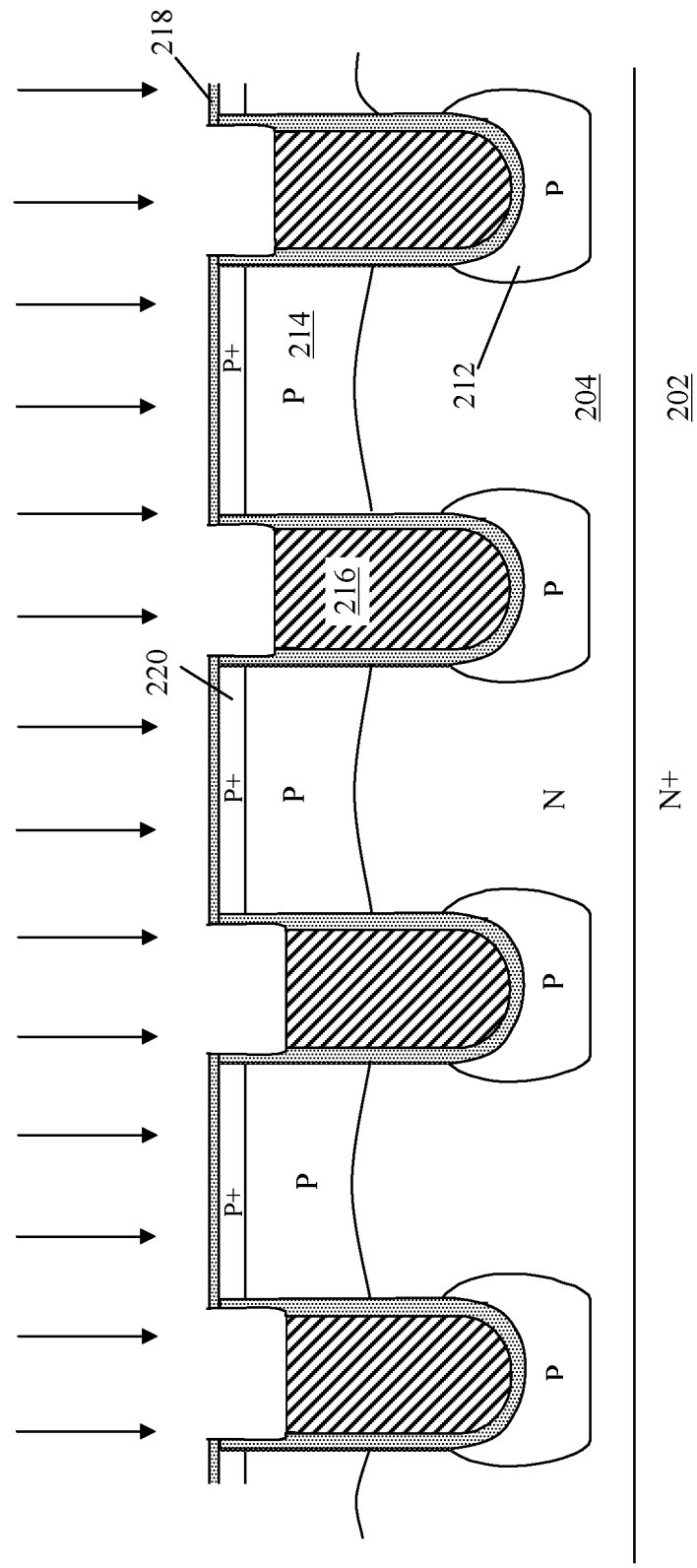

The gate oxide 210 at the exposed sidewall of the trenches 206 is thinned to a few hundred Armstrong thick 218 as shown in FIG. 2D for the next implantation step. P-type implantation, such as BF2 of a dose of 5e13 $cm^{-2}$ to 5e15 $cm^{-2}$, is carried at a low energy of 10 keV to 20 keV at a zero angle to form a P+ body contact layer 220 at the top surface of the substrate 204 as shown in FIG. 2E. Alternatively, the P+ body contact layer 220 may be implanted before the thickness of the top portion of gate oxide 210 is reduced.

Figure 2F:
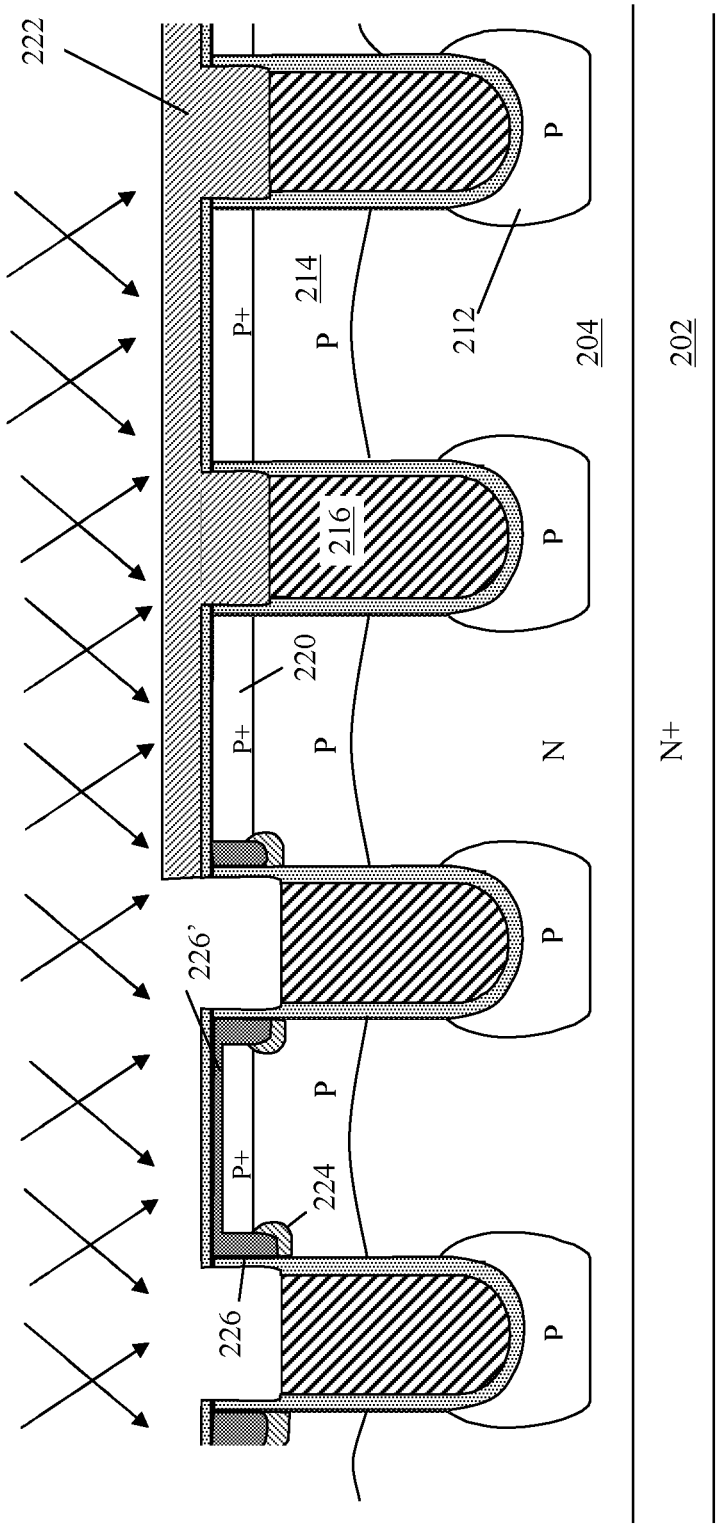

As shown in FIG. 2F, a second photoresist 222, which is a N+ source mask, is applied on top of the substrate 204 to block N/N+ implantation in the next step going into cells beneath gate and source metal isolation. As shown in FIG. 2F, the source mask covers at least a gate contact trench 206-1, a dummy gate trench 206-2 with active gate trenches 206-3 and 206-4 exposed. Ideally the source mask 222 may extend slightly over the edge of active gate trench 206-3 on the side near the dummy gate trench 206-2 thus partially covering the first active gate trench 206-3 next to the dummy gate trench 206-2 such that no source implant would go into the mesa between the first active gate trench 206-3 and the dummy gate trench 206-2. Alternatively the edge of the source mask 222 may recess from the active gate trench 206-3 to enable source region formed along both side walls of the active gate trench 206-3. No source region formed along the dummy gate trench or gate contact trench.

N-type implantation is then carried out at an angle to form a lightly doped source regions 224 followed by a heavy concentration N-type implantation at an angle to form self-aligned N+ source regions 226 on top of the lightly doped source regions 224. The lightly doped source regions 224 extending deeper and broader than the self-aligned N+ source regions 226 ensures that the source region overlaps with the gate electrode 216 thereby making the device structure more manufacturable. The N-type implantation may include an angled implantation of Phosphorous at a dose of 5e12 $cm^{-2}$ to 5e13 $cm^{-2}$ and at an energy of 20 keV to 40 keV forming N regions 224 followed by an angled implantation of Arsenic at a dose of 5e15 $cm^{-2}$ and at an energy of 30 keV to 80 keV forming heavily doped source regions 226 along the side wall of gate trench and heavily doped source layer 226' on top of P+ body contact layer 220. In this implantation step, the polysilicon 216 in the trenches 206 is also used as a reference for better threshold voltage ($V_T$) control. Thus, the photoresist is removed. Preferably the implantation angles are the same for both lightly doped source regions 224 and the heavily doped source regions 206. The dopants of lightly doped source regions 224 are implanted to penetrate deeper and further away from the gate trench side walls than the dopants of heavily doped source regions 226 therefore forming wider and deeper regions 224 such that the spacing between two adjacent lightly doped source regions 224 in a mesa is narrower than the spacing between two adjacent heavily doped source regions 226. The heavily doped source layer 226' is formed by counter doping the upper portion of the P+ body contact layer 220 and is shallower than the P+ body contact layer 220.

Figure 2G:
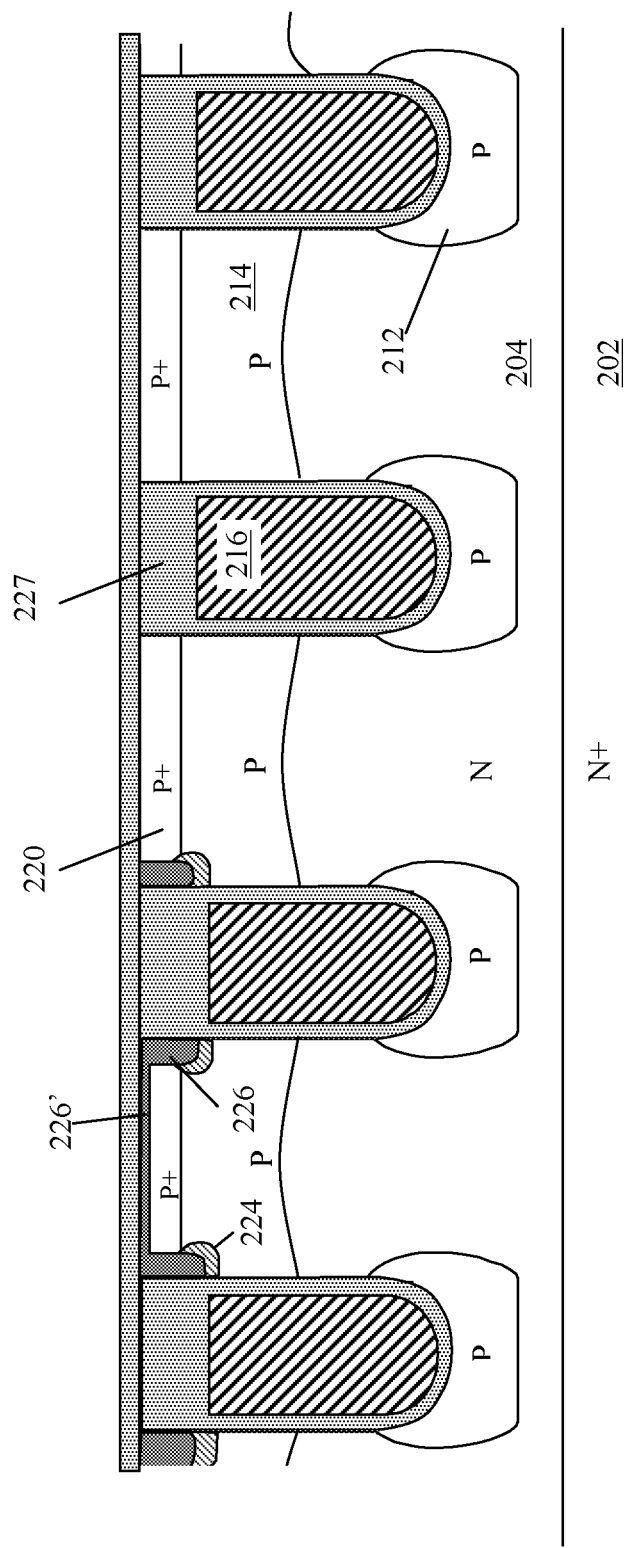

As shown in FIG. 2G, a dielectric layer 227, e.g., an oxide, is deposited to fill in the remaining portion of the trenches on top of the polysilicon 216 and also on top of the substrate 204. The oxide 227 on top of the substrate 204 is then planarized, for example by etching or CMP, leaving a thin dielectric layer, about 0.2 μm to 0.8 μm, on top of the mesa of the substrate. Alternatively, the oxide on top of the substrate is removed and a thin dielectric layer is then deposited on top of the mesa of the substrate.

Figure 2H:
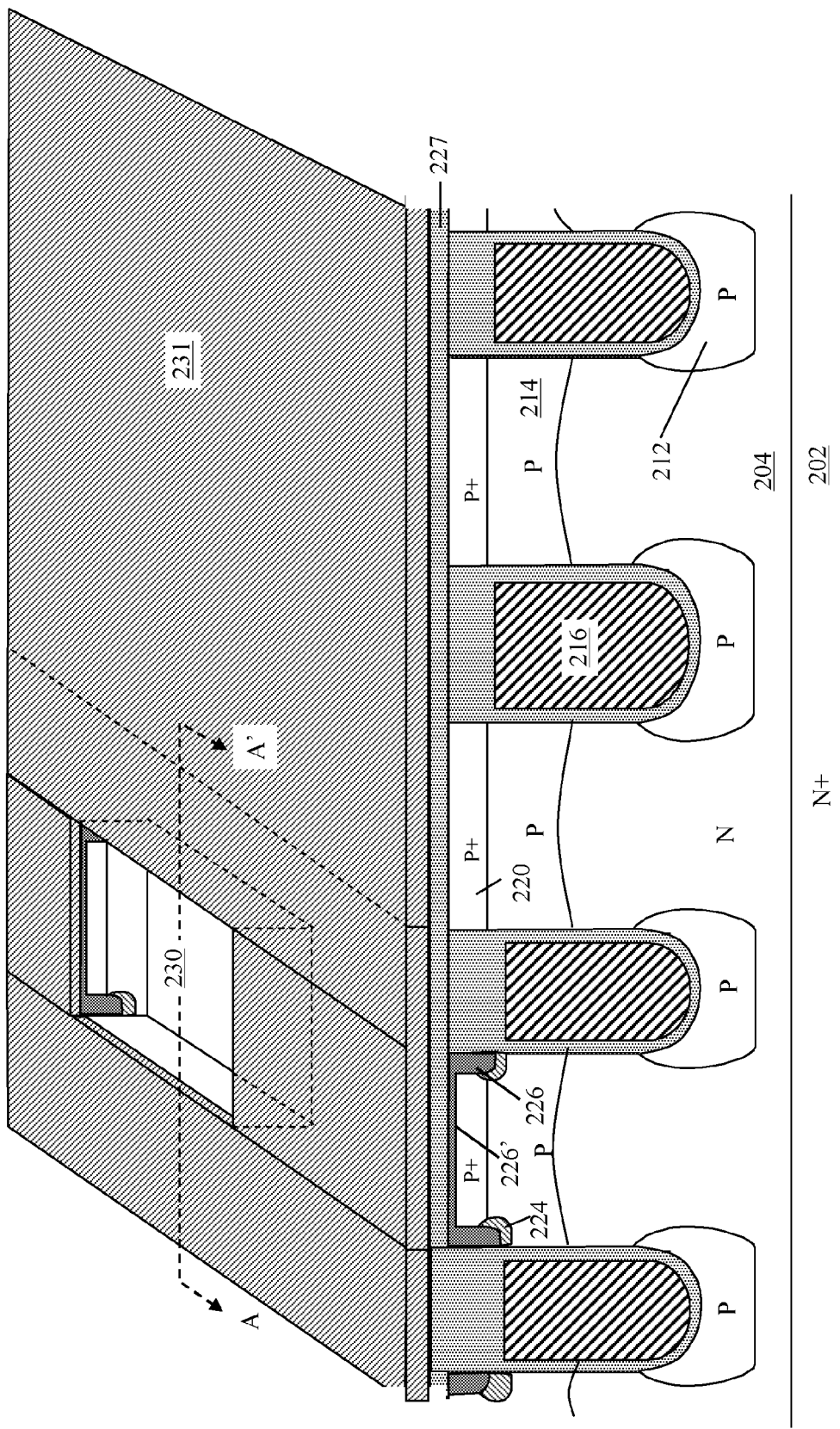
Figure 2I:
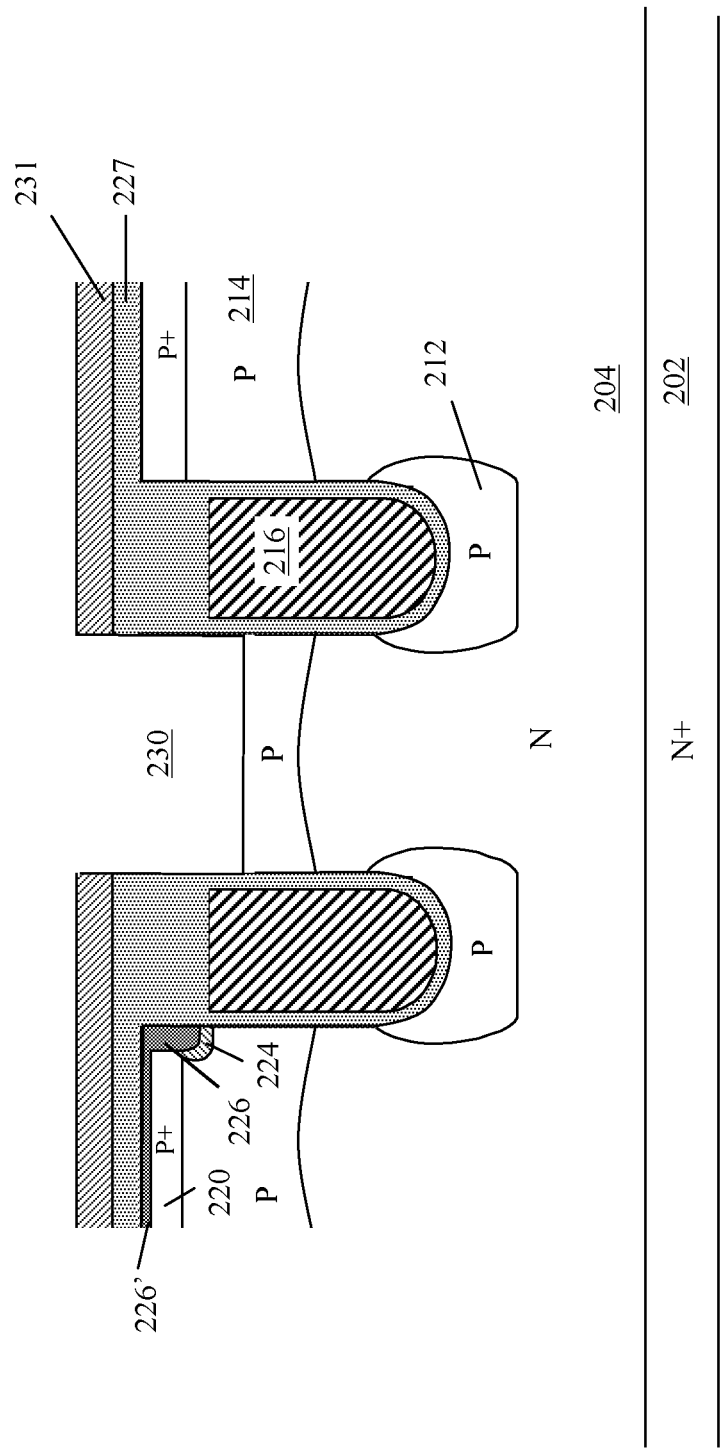

A third photoresist 231, which is a third dimensional P+ contact mask, is formed on the oxide 227 and then developed followed by patterning the oxide 227 to form the openings in the oxide 227 in the mesa between two adjacent gate trenches 206 as shown in FIG. 2H. Preferably a plurality of openings are layout periodically along the length of each semiconductor mesa between two adjacent active gate trenches and each opening extends across the entire width of the semiconductor mesa at least penetrate through the source layer 226'. The openings disposed on adjacent mesas are preferably inter-digitized with each other. For simplicity only one such opening is shown in FIG. 2H. The opening 230 for a deep P+ contact at the third dimension is formed by etching the substrate through the opening in the oxide 227 to a depth below the top level of the polisilicon 216 in the trenches 206. FIG. 2I is a cross-sectional of the structure shown in FIG. 2H along a line A-A'.

Figure 2J:
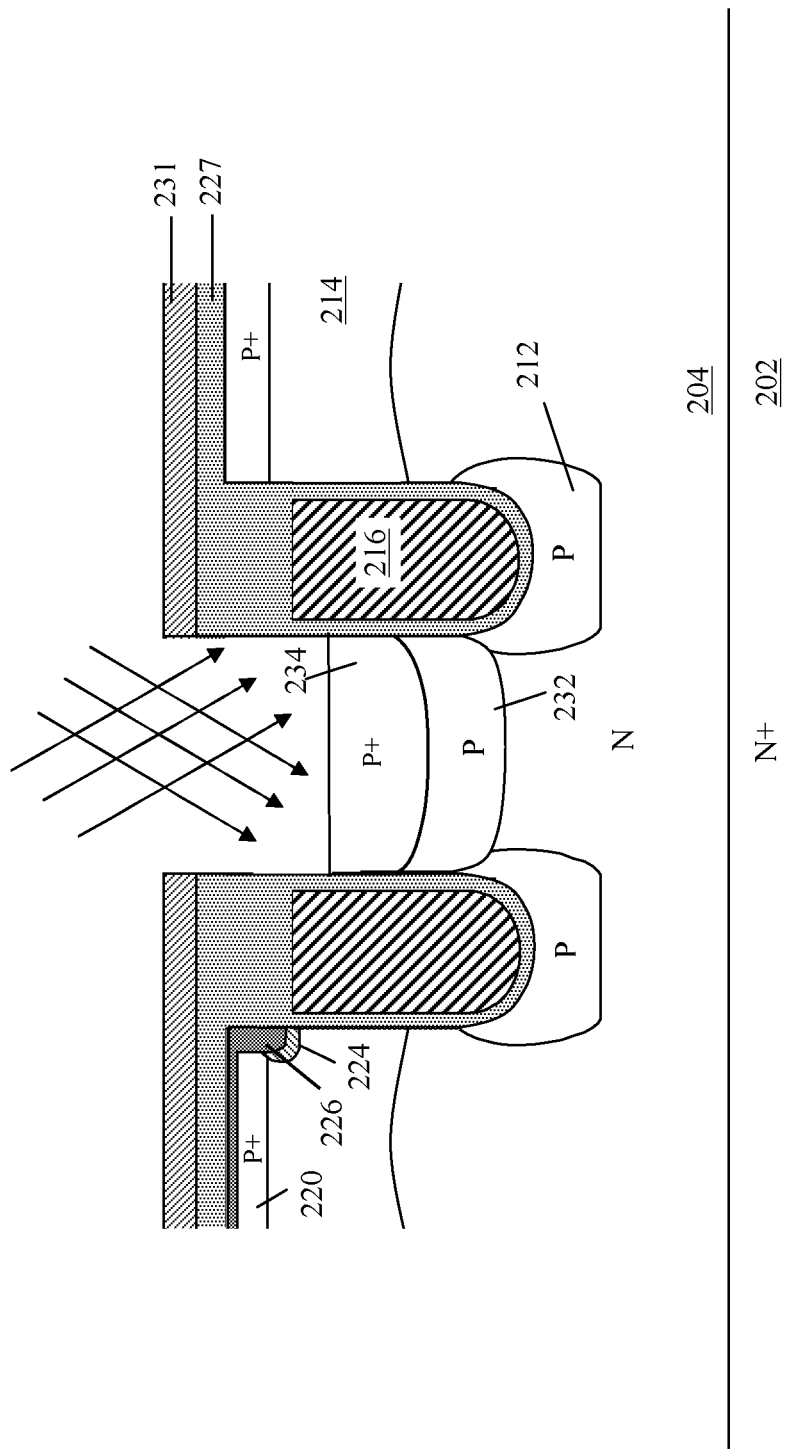

P-type implantation is carried out through the opening 230 on the top portion of the remaining of the substrate, which includes the implantation of Boron of a dose about 2e15 $cm^{-2}$ to 5e13 $cm^{-2}$ and at a high energy of about 100 keV to 600 keV to form the deep P implant region 232 followed by the implantation of BF2 of a dose about 1e15 $cm^{-2}$ to 5e15 $cm^{-2}$ and at a low energy of about 10 keV to 40 keV to form deep P+ contact region 234 above the P implant region 232, where the P implant region 232 extending below the body region connects the P shield implant regions 212 to the P+ contact region 234 as shown in FIG. 2J. In one embodiment, the P shield implant regions 212 extending a width wider than the trench surrounds the bottom of gate trench having a top edge on one side of the trench spaced apart from the bottom of the body region 214 and another top edge on the other side of the trench intersects with the deep P implant region 232. In one preferred embodiment, the bottom of deep P shield implant region 232 is shallower than the bottom of the gate trenches. In another preferred embodiment, the third dimensional deep heavily doped contacts 234 may extend the entire width of the semiconductor mesa down to a depth substantially the same as the bottom of the less heavily doped body region 214, or slightly exceeding below the body region 214, to pin the device breakdown at these third dimensional deep heavily doped contacts 234.

Figure 2K:
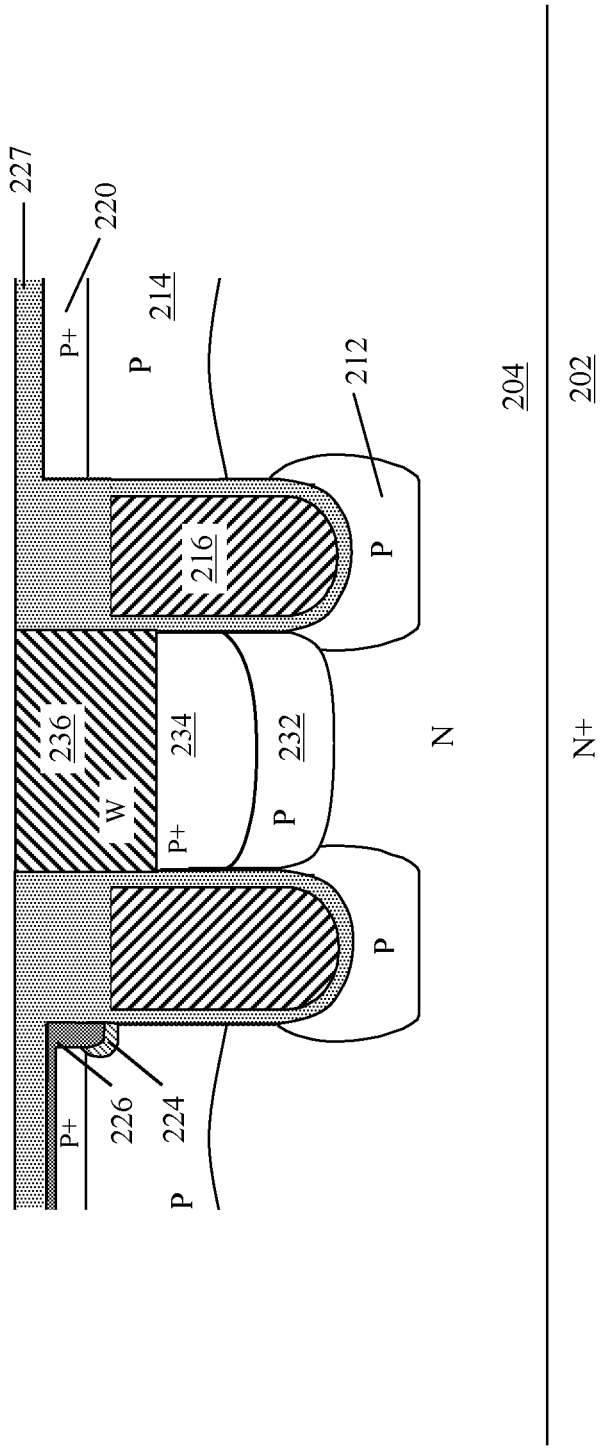
Figure 2L:
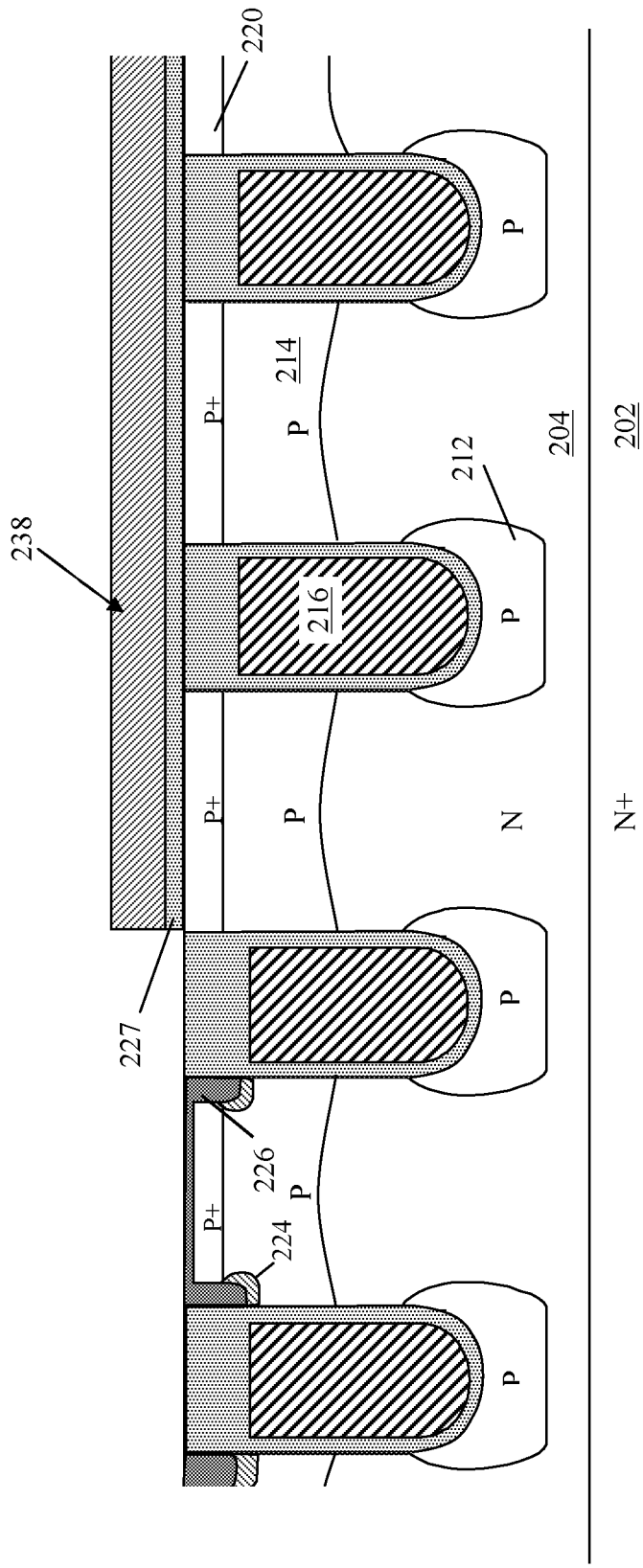
Figure 2M:
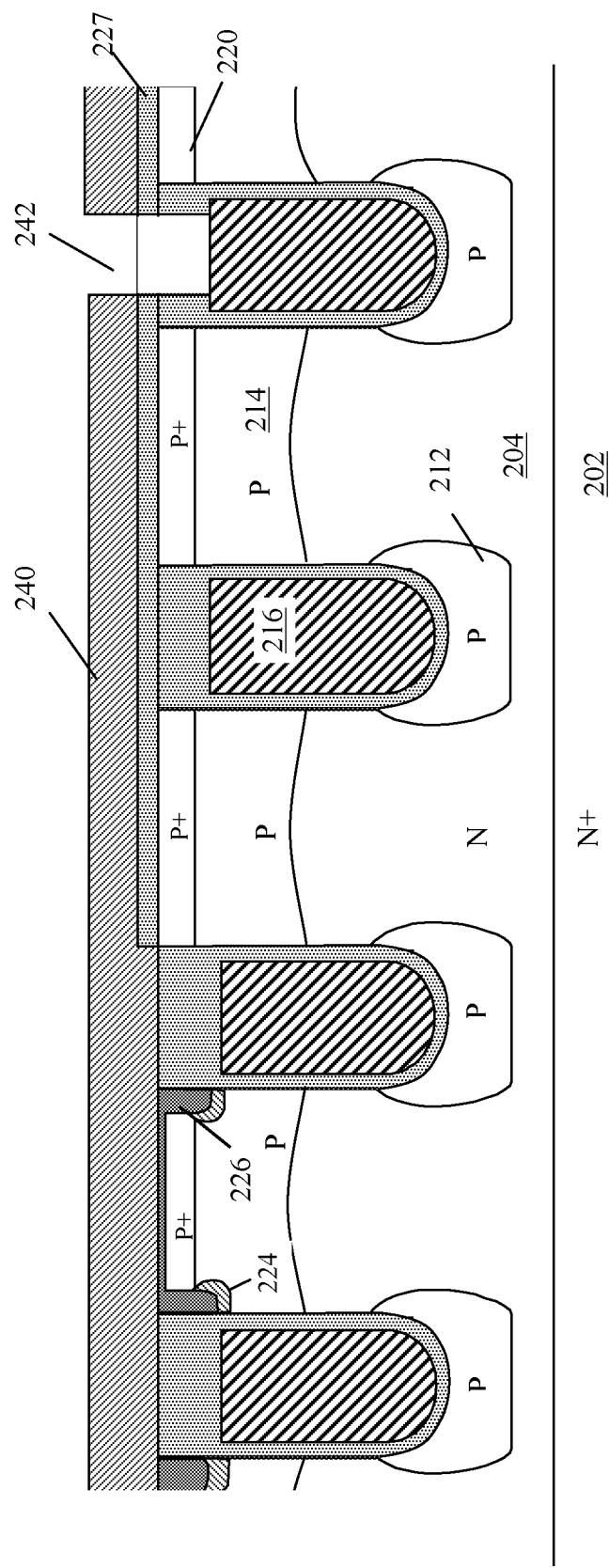
Figure 2N:
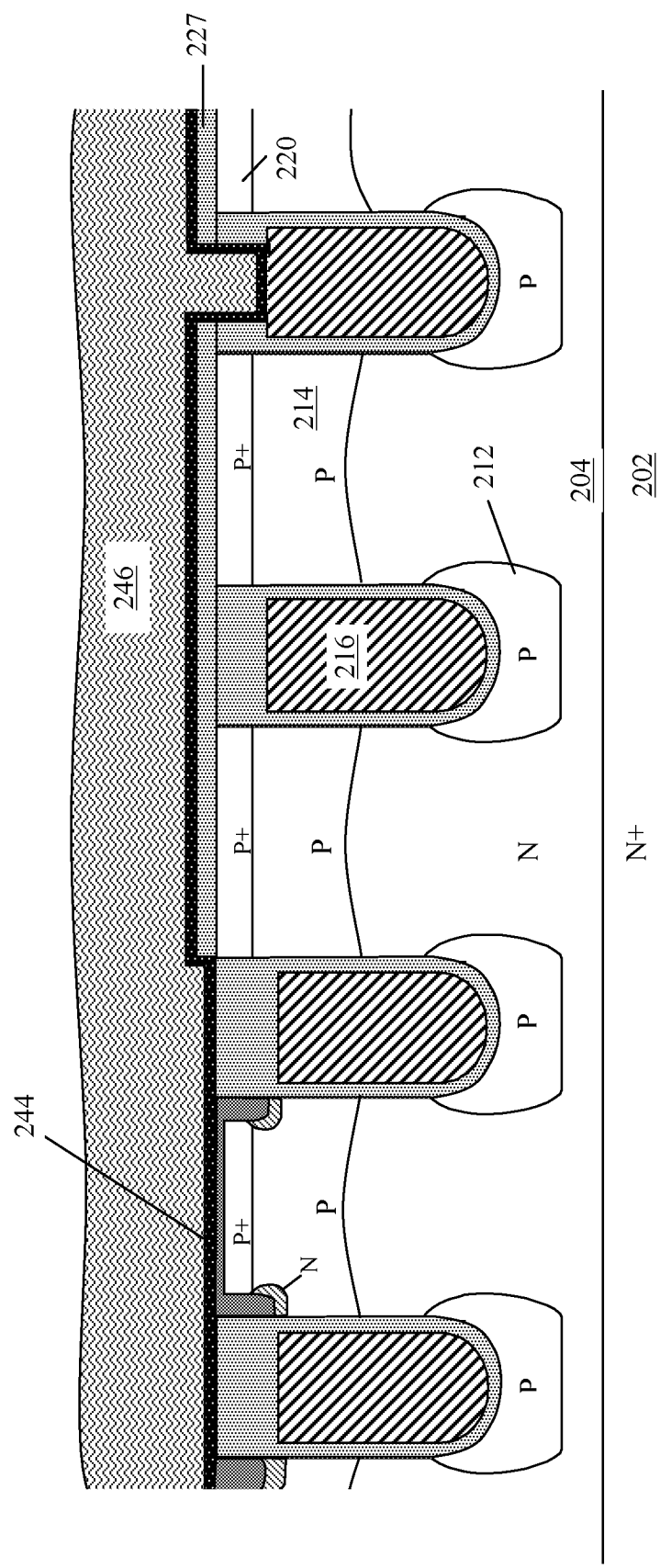
Figure 20:
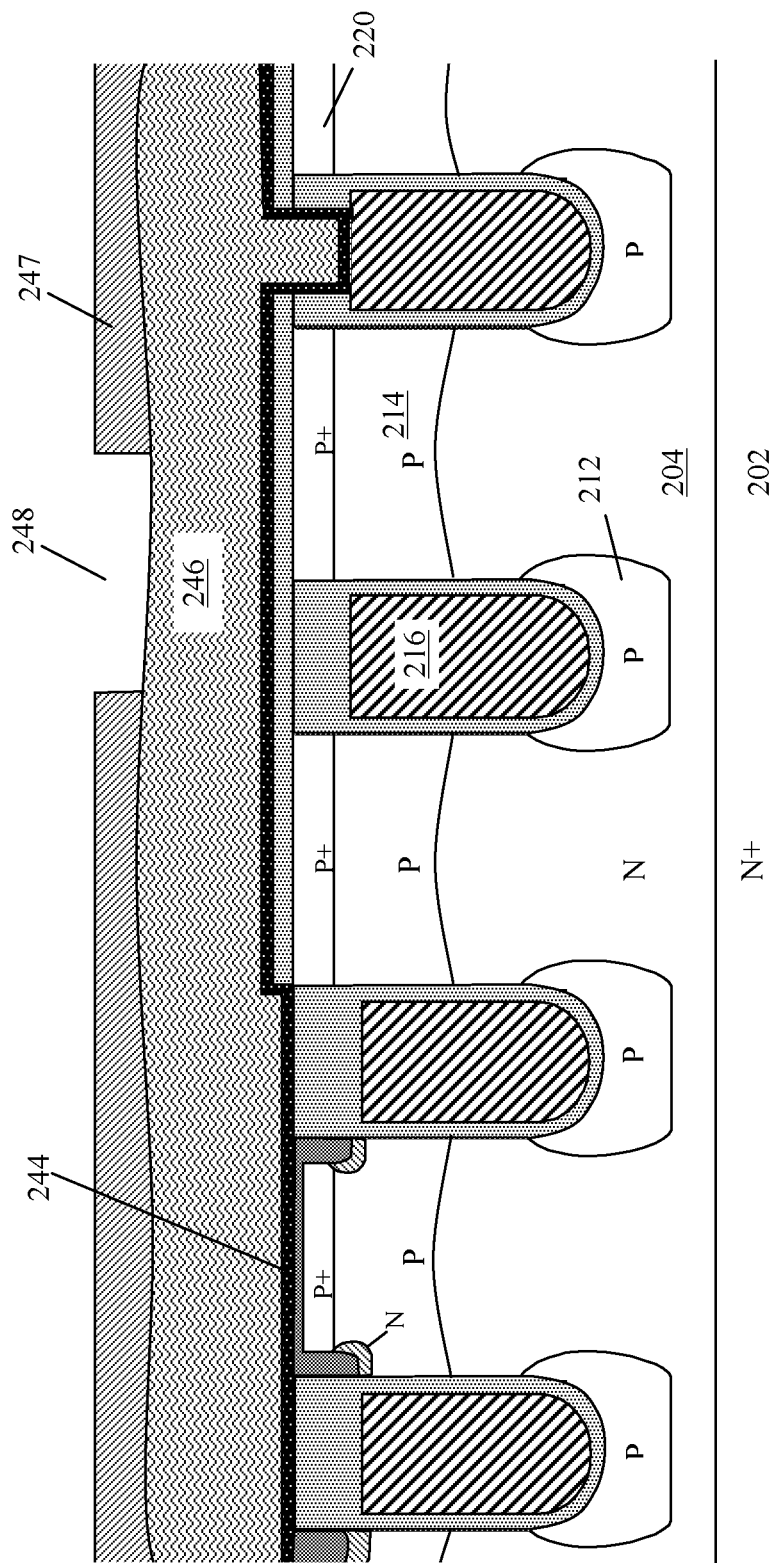

Third photoresist 231 is thus removed and a metal 236, preferably Tungsten (W), is deposited on top of P+ contact region 234 to fill the opening 230 as shown in FIG. 2K. A fourth photoresist 238, which is an active area contact mask, is formed on the oxide layer 227 on top of the substrate with openings on the active area followed by the etching of the oxide layer 227 through the openings to expose the active cells as shown in FIG. 2L. The photoresist 238 is then removed with the oxide layer covering the mesas of dummy cell. A fifth photoresist 240, which forms a gate contact mask, is applied on top of the substrate and patterned with openings 242 over the gate contact trench 206-1 for the formation of gate contact for the gate electrode 216 inside the trenches 206 in the termination area as shown in FIG. 2M. The photoresist 240 is then removed. A barrier metal layer 244, which includes Ti/TiN, is deposited on top of the substrate, then a metal layer 246, for example Al or Al:Si:Cu metal, is deposited on top of the barrier metal layer 244 as shown in FIG. 2N.

Figure 2P:
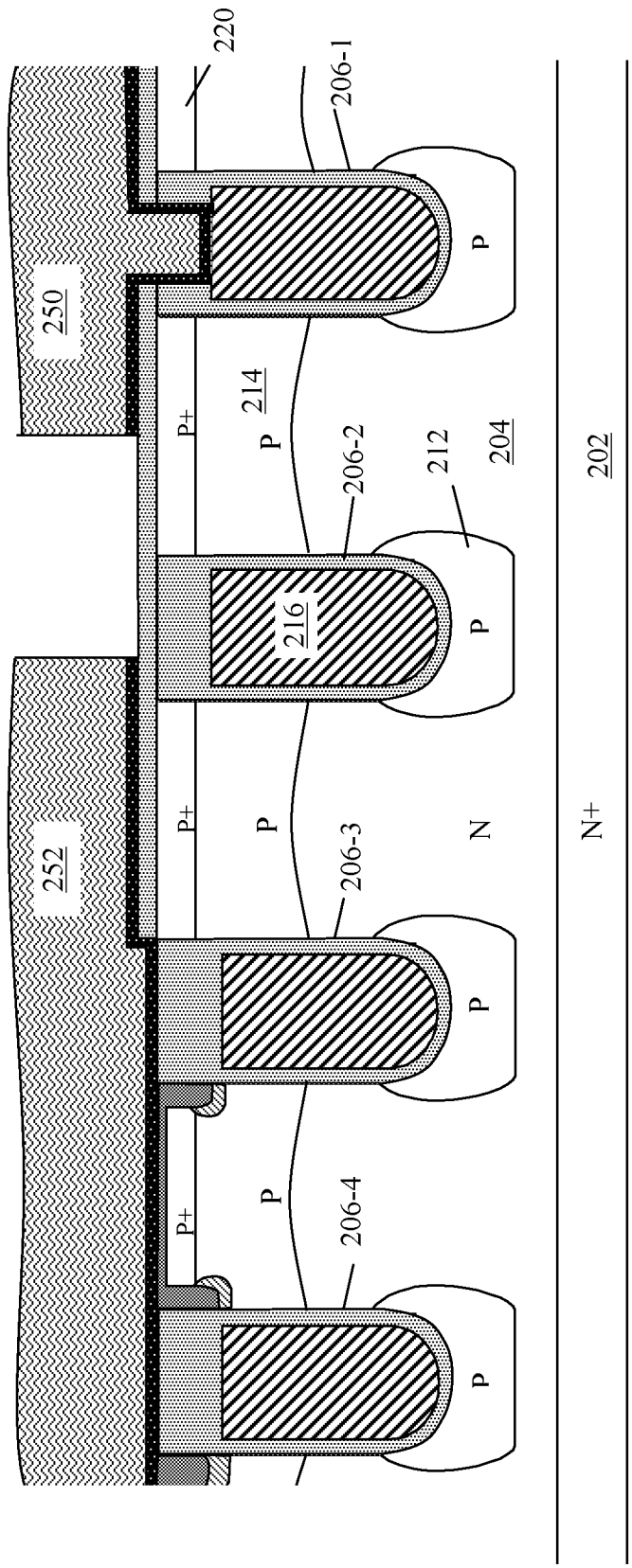

As shown in FIG. 2O, a sixth photoresist 247, which is a metal mask, is applied on top of metal 246 with an opening 248 for separation of gate metal and source metal. The metal 246 thus is etched to remove a portion of the metal layer over the oxide layer covering the dummy cell area to separate the source metal 252 from gate metal 250. By way of example, only one dummy gate trench is included under the gap between source metal 252 and gate metal 250 as shown in FIG. 2P, however, additional dummy gate trenches may be formed between gate contact trench 206-1 and active gate trench 206-3 to provide multiple dummy cells under the gap between the source metal 252 and gate metal 250. The dummy cells are covered by oxide to block metal connection to the mesas of dummy cells. Furthermore, for a requirement of forming the contact pads, passivation layer may be deposited on top of the substrate and a seventh photoresist, which is a passivation mask, may be applied to expose the pad areas.

Figure 3A:
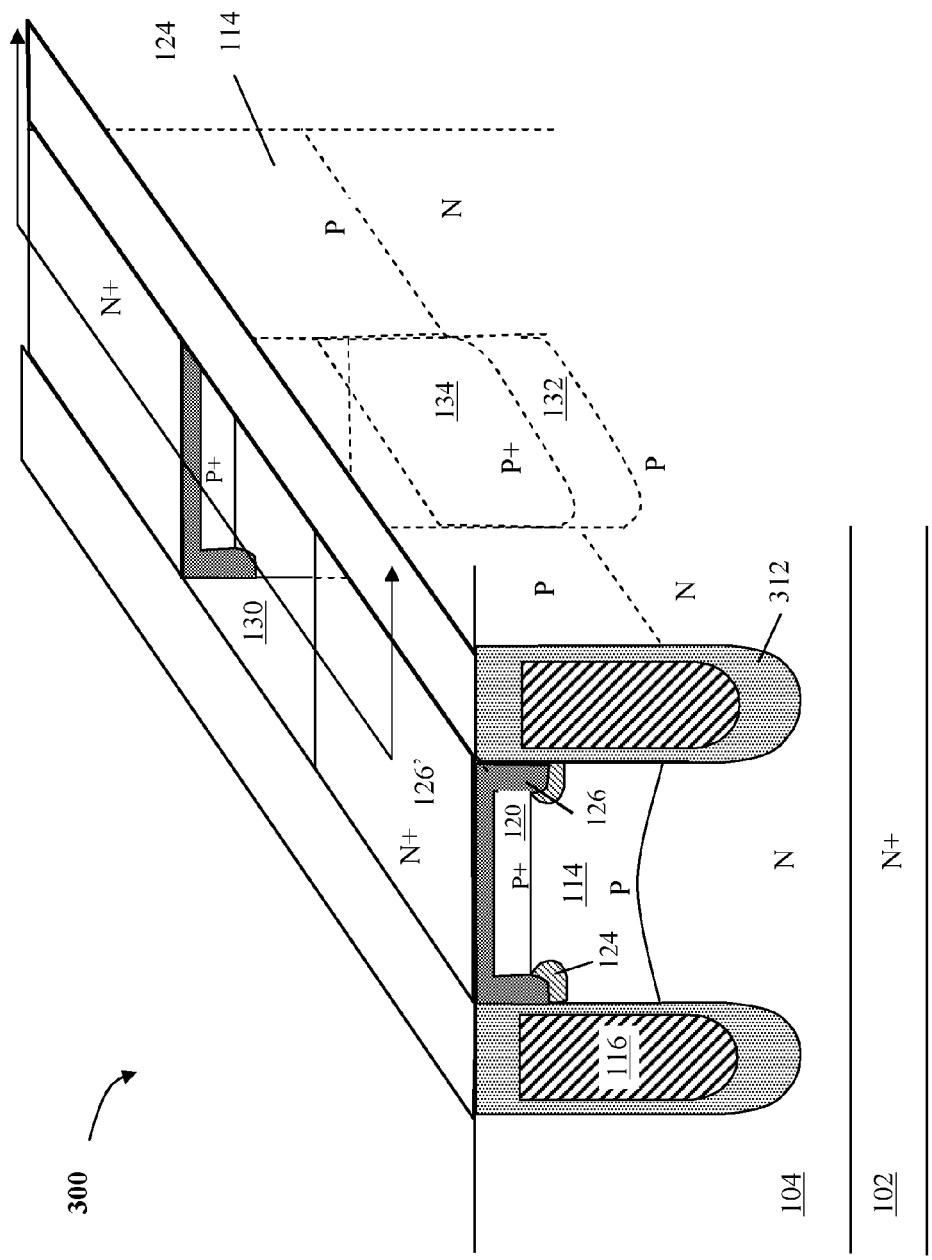
FIG. 3A is a three-dimensional view of a nano-MOSFET with a third dimensional deep P+ contact and thick bottom oxide (TBO) according to a second embodiment of the present invention.

The nano-MOSFET with third dimensional deep P+ contact of the type depicted in FIG. 1A can also be applied for a nano-MOSFET with a thick bottom oxide (TBO). FIG. 3A is a three-dimensional schematic diagram of a nano-MOSFET with third dimensional deep P+ contact with TBO 300 according to a second embodiment of the present invention. The device 300 is similar to the device 100 except that, a thick bottom oxide (TBO) 312 is formed inside and at the bottom of each trench 106, under the gate electrode 116, for shielding the gate electrode 116 therefore shielding implant under the gate trench is not needed.

As a result the deep P implant region 132 below the third dimensional deep P+ contact region 134 becomes optional as the connection to the deep P implant region 112 is needed.

Figure 3B:
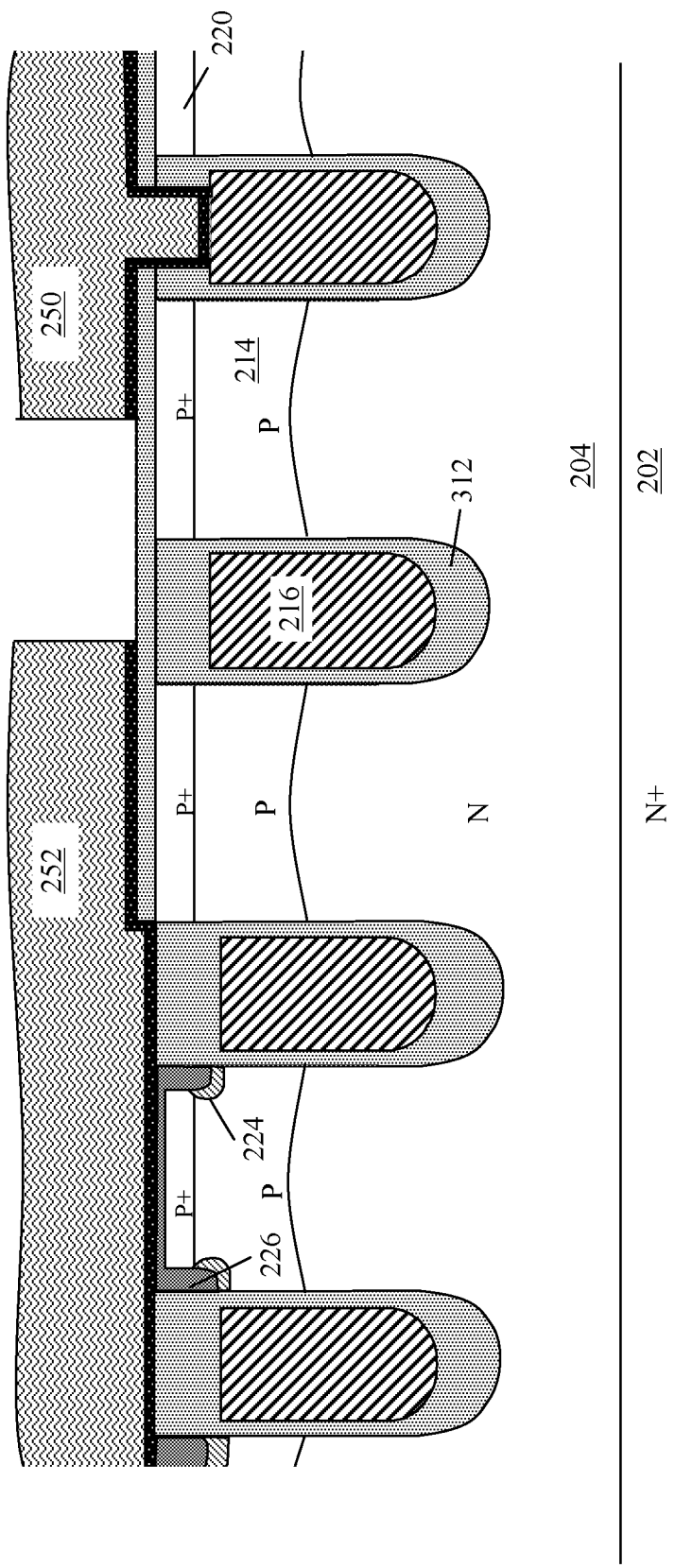
FIG. 3B is a cross-sectional view a nano-MOSFET with a third dimensional deep P+ contact and thick bottom oxide (TBO) according to a second embodiment of the present invention.

FIG. 3B is a cross-sectional schematic diagram of the device 300 after source and gate metal are formed. The structure of the device 300 in FIG. 3B is similar to the structure of the device shown in FIG. 2P, except that the deep P implant region 212 at the bottom of trench 206 is replaced with the thick bottom oxide 312 for shielding the gate electrode 216 inside the trench 216. As such, the process of making the device 300 is similar to the process shown in FIGS. 2A-2P with the implant of P-type dopant through the trench bottom in FIG. 2B omitted.

A nano-MOSFET with a third dimensional deep P+ contact of the type depicted in FIG. 1A and FIG. 3A can also be implemented for devices having a shield gate trench (SGT) MOSFET configuration, in which a shield electrode is formed below the gate electrode inside the trench as the gate structure shown in FIG. 9.

Figure 4A:
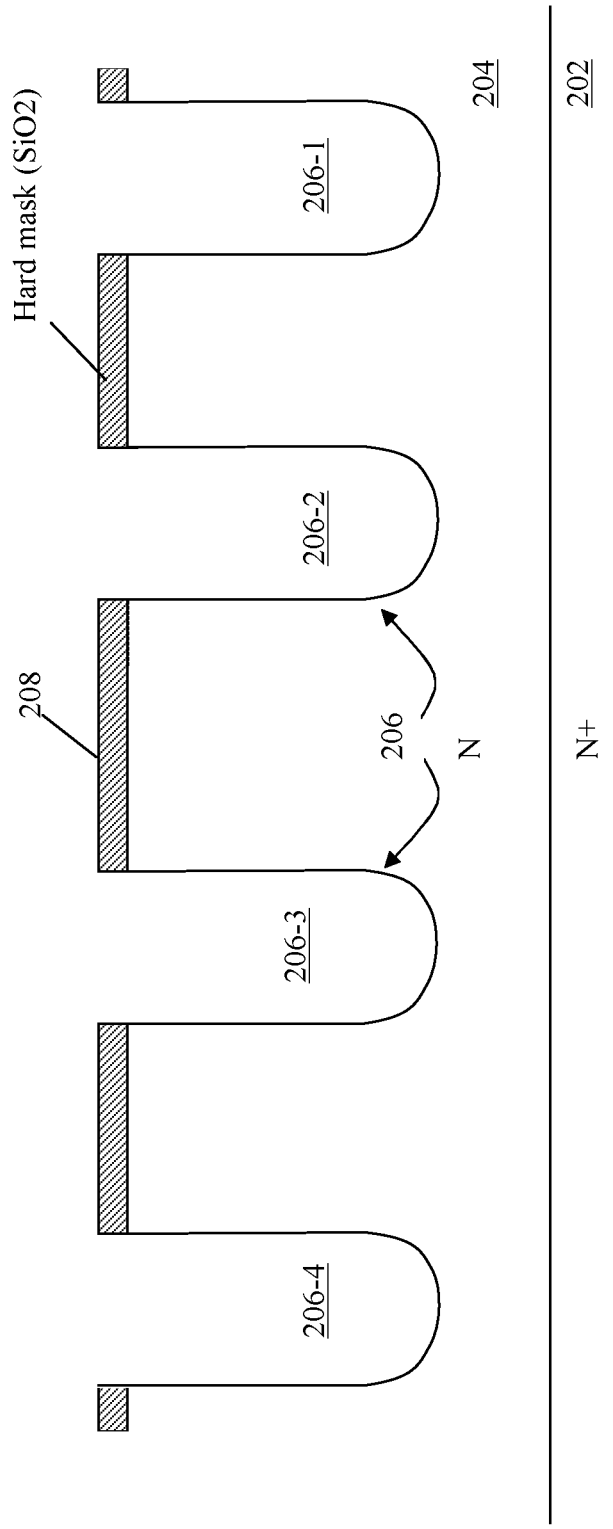
FIGS. 4A-4N are a sequence of cross-sectional schematic diagrams illustrating a method of fabrication the Schottky-Source nano-MOSFET with third dimensional deep P+ contact and deep P implant according to a third embodiment of the present invention.
Figure 4B:
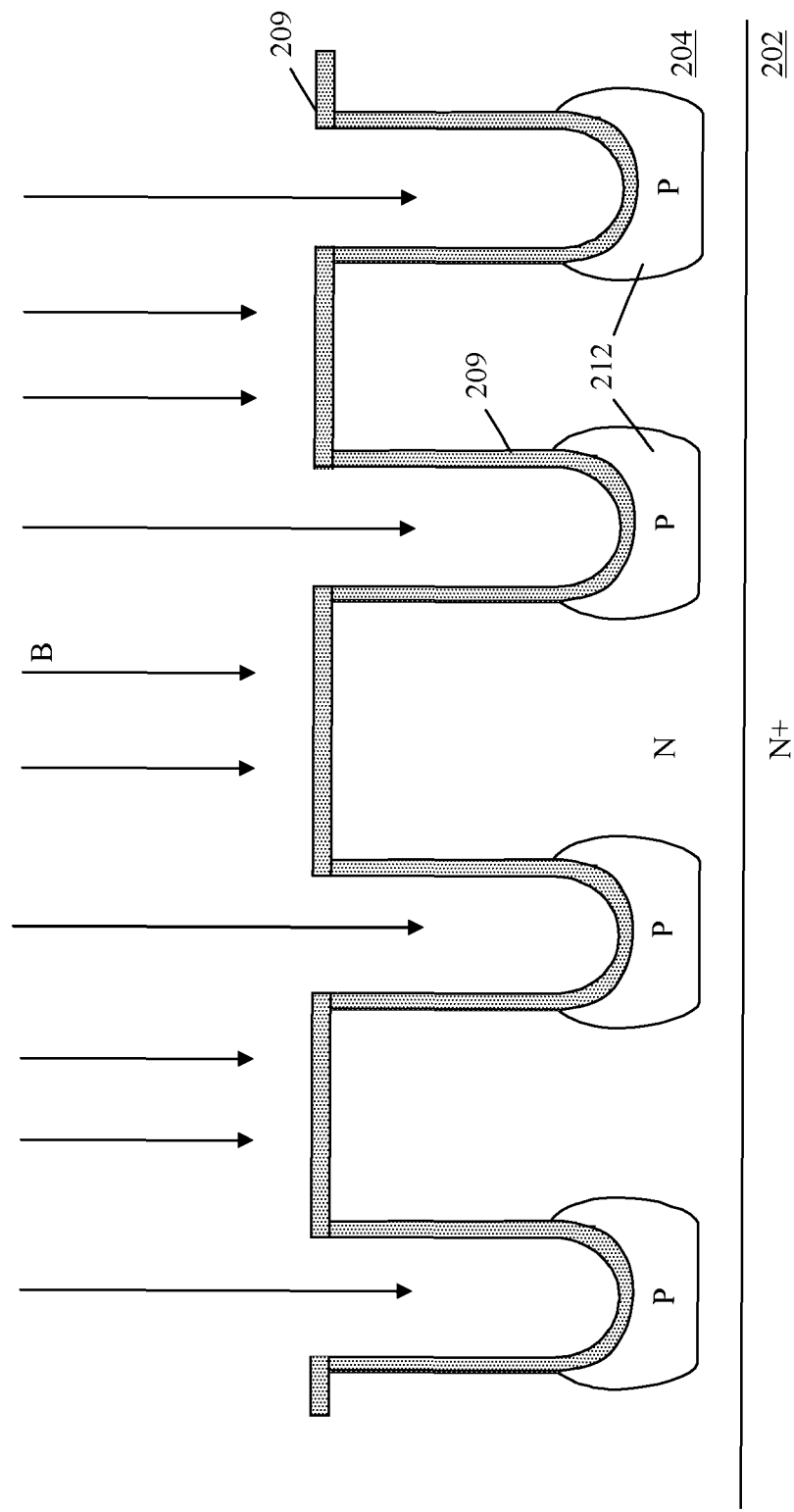

Nano MOSFET technology can be further ruggedized by replacing N+ source region with Schottky Contact. FIGS. 4A-4N are cross-sectional schematic diagrams illustrating a process of manufacturing a Schottky-Source Nano MOSFET with third dimensional deep P+ contact and deep P implant for shielding gate electrode according to a third embodiment of the present invention.

As seen in FIG. 4A, the process may begin by forming an initial layer of insulator, e.g., oxide 208, on the N-type semiconductor substrate 204, a lower portion 202 of which is heavily doped with the N-dopant to act as a drain. A first photoresist (not shown), which is a trench mask, may be formed on the oxide 208 and then developed followed by patterning the oxide 208 to form the openings in the oxide 208. The trench mask is removed and gate trenches 206, including contact gate trench 206-1, dummy gate trench 206-2, active gate trenches 206-3 and 206-4 as shown, may then be etched in the semiconductor substrate 204 through the openings in the oxide 208. Additional active gate trenches are usually formed to provide MOSFET cells in stripe layout. As shown in FIG. 4B, liner insulator 209 (e.g., another oxide) may then be formed on exposed portions of the substrate 204 including side and bottom walls of the gate trenches 206. P type dopant, such as Boron, is implanted at a high energy of about 30 keV to 200 keV to form shield regions 212 at the bottom of the trenches 206. The shield implant regions 212 extending to a width wider than the gate trench surrounds the bottom of gate trench.

Figure 4C:
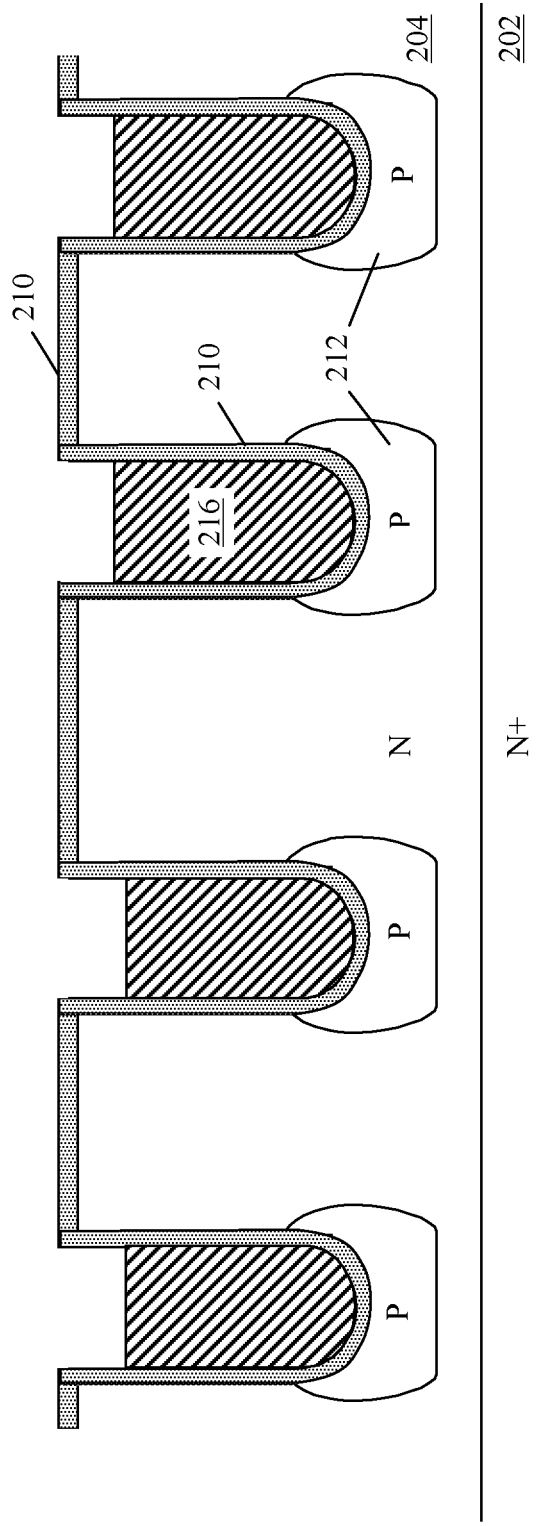
Figure 4D:
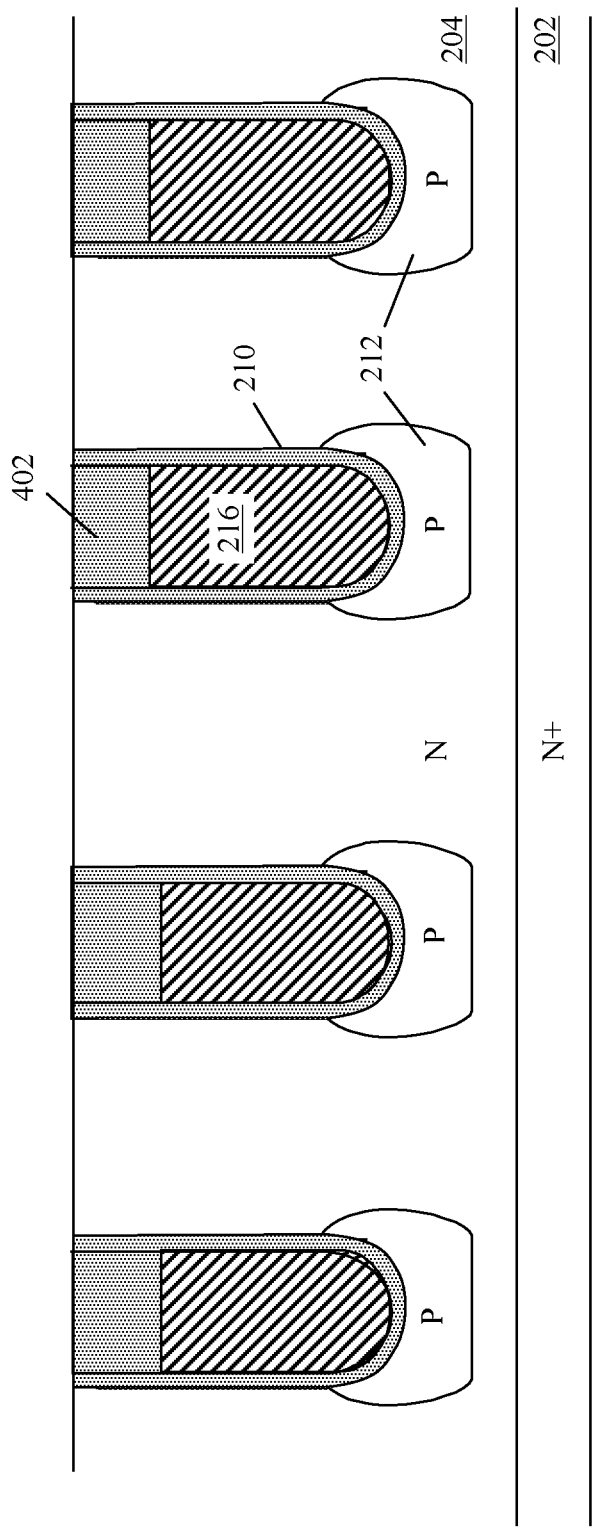

As shown in FIG. 4C, the oxide layer 209 is then removed followed by the growth of gate oxide 210 on exposed portions of the substrate 204 including side and bottom walls of the gate trenches 206. For a low voltage device, the thickness of the gate oxide 210 is in a range of 50 Å to 500 Å. Conductive material, such as polysilicon with heavily doped N-type, is deposited inside the trenches 206 to form gate electrode 216, which is then etched back to a predetermined depth below the top surface of the substrate 204. A dielectric material 402, such as SiO2 or Si3N4, is deposited to fill the remaining portion of the trenches 206, thus the dielectric material is removed from the surface of the mesa region on the substrate by etching or CMP as shown in FIG. 4D.

Figure 4E:
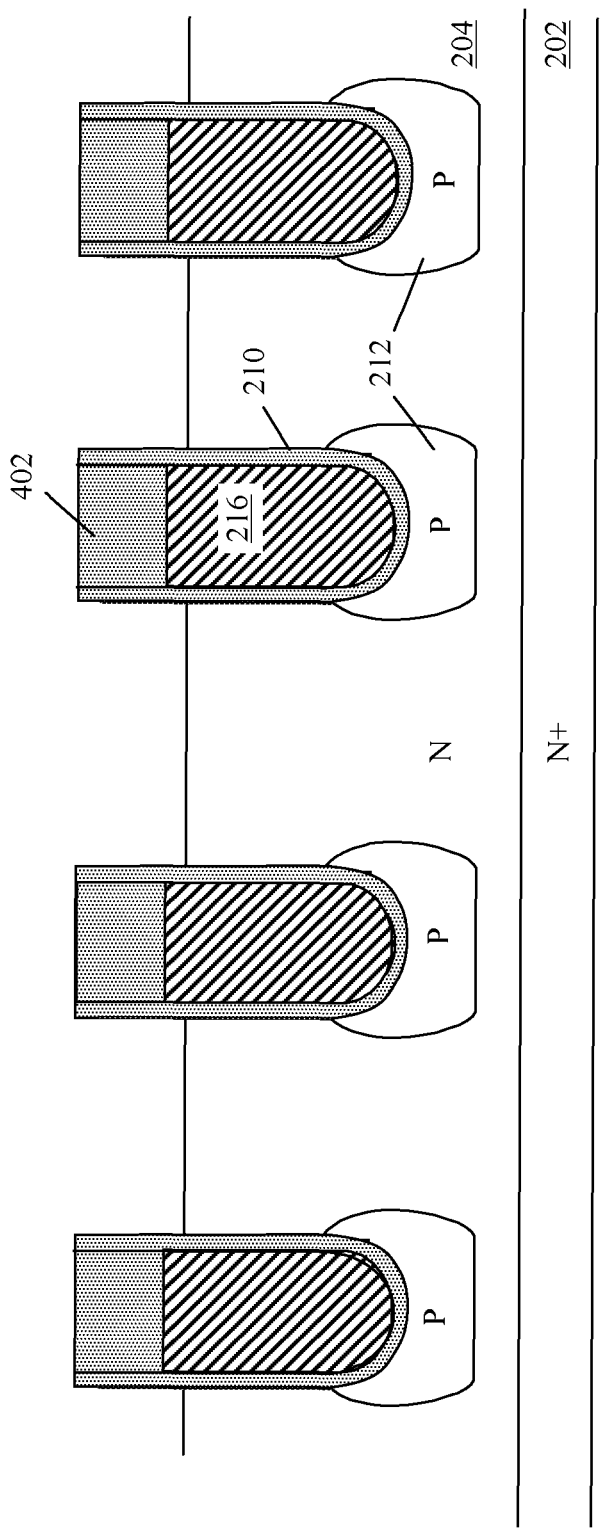
Figure 4F:
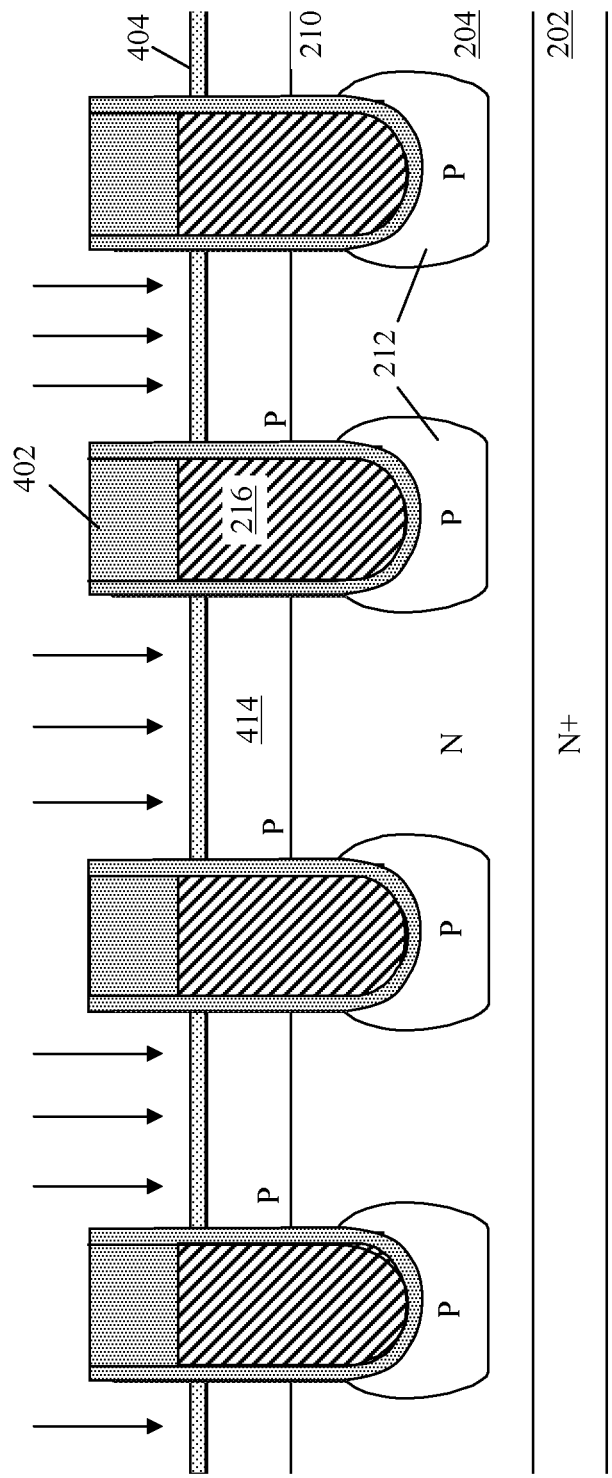
Figure 4G:
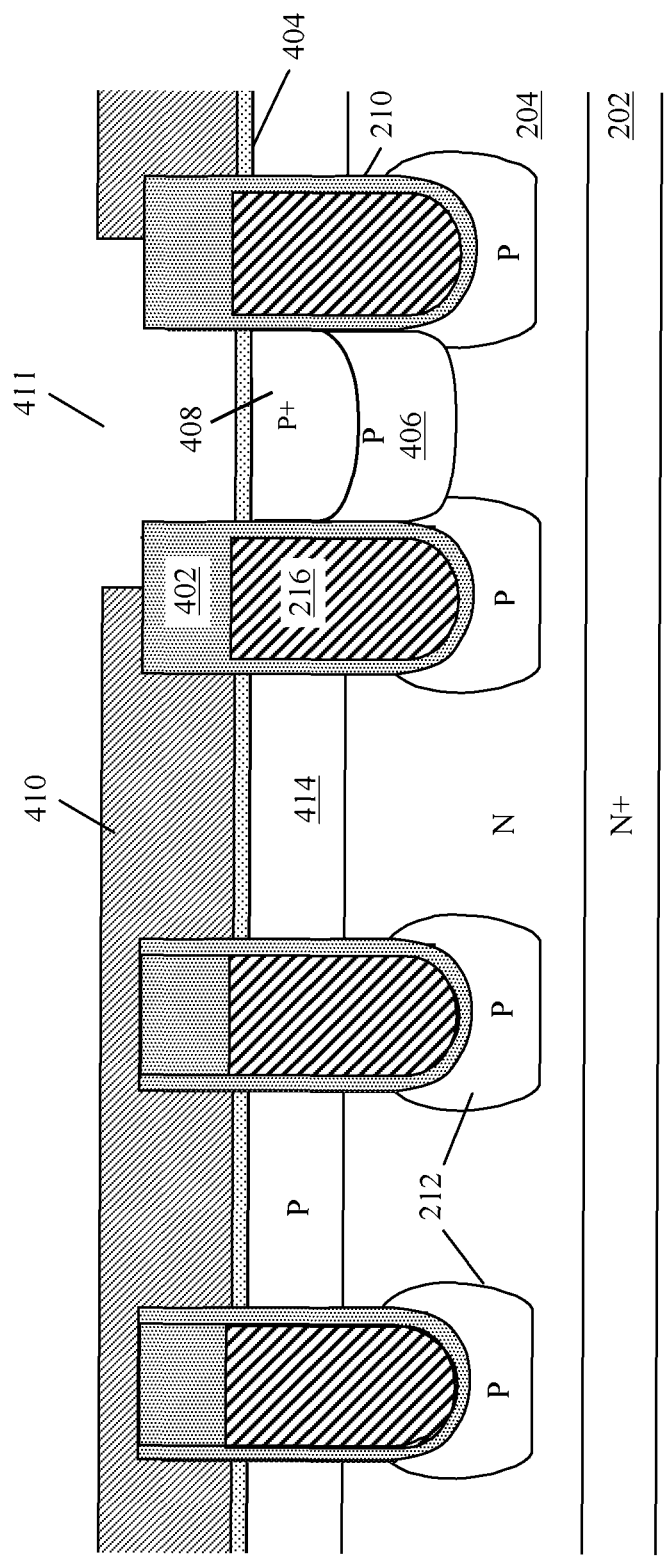
Figure 4H:
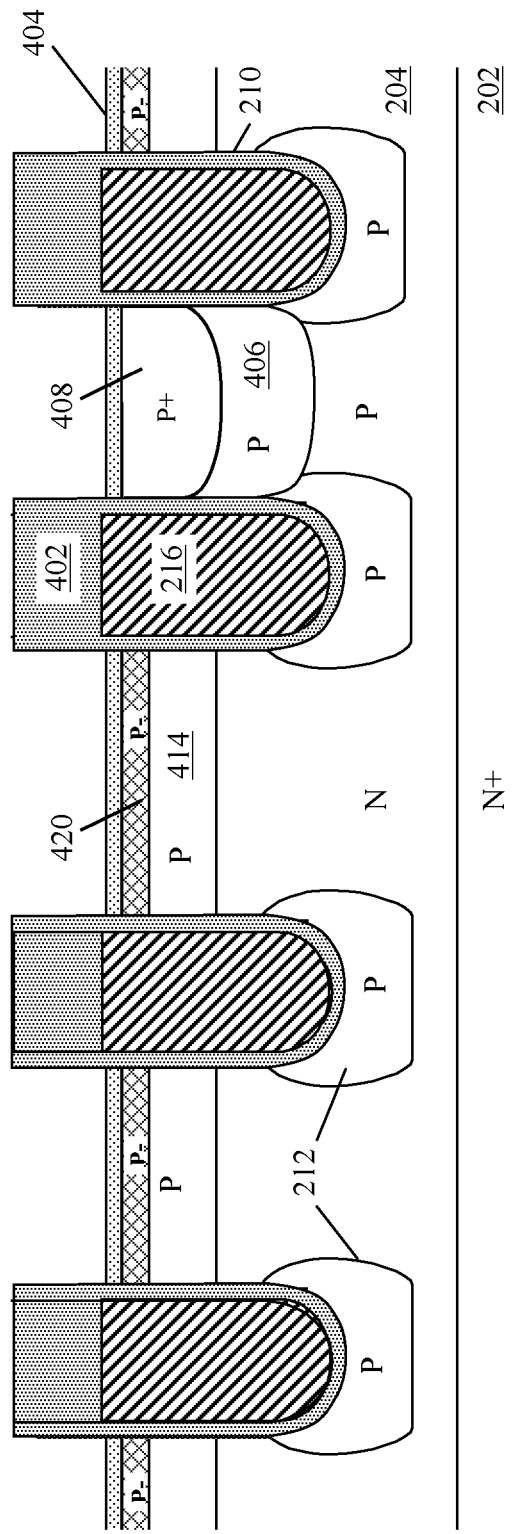

The silicon at the mesa region, between two adjacent trenches 206, is etched back to a predetermined depth lower than the top surface of the polysilicon gate 216 in the trench 206 as shown in FIG. 4E. A thin oxide layer 404, about 100 A° to 300 A°, is grown on top of the etched silicon substrate followed by a P-type implantation to form the P-body layer 414 as shown in FIG. 4F. A bottom of P body region 414 space away and above the shield implant regions 212. A second photoresist 410, which is a third dimensional P+ contact mask, is formed on the oxide 404 with the openings 411 located at the mesa between two adjacent gate trenches 206 as shown in FIG. 4G. Preferably a plurality of openings 411 may be layout periodically along the length of each semiconductor mesa between two adjacent gate trenches, including the dummy gate trenches and the gate contact trench, and each opening extends across the entire width of the semiconductor mesa. The openings disposed on adjacent mesas are preferably interleaved with each other. For simplicity only one such opening is shown in FIG. 4G between the dummy gate trench and the gate contact trench. P-type implantation is carried out through the opening 411 on the top portion of the remaining of the substrate, which includes the implantation of Boron to form the deep P implant region 406 followed by the implantation of Boron or $BF_2$ of a dose about 5e14 $cm^{-2}$ to 5e15 $cm^{-2}$ to form deep P+ contact region 408 above the P implant region 406, where the P implant region 406 extending below the body region connects the P shield regions 212 to the P+ contact region 408 as shown in FIG. 4G. In one embodiment, the shield implant regions 212 extending a width wider than the gate trench surrounds the bottom of gate trench having a top edge on one side of the trench spacing apart from the bottom of the body region 414 and another top edge on the other side of the trench intersecting with the deep P implant region 406. In another embodiment the third dimensional deep heavily doped contacts 408 may extend the entire width of the semiconductor mesa down to a depth substantially the same as the bottom of the less heavily doped body region 414, or slightly exceeding below the body region 414, to pin the device breakdown at these third dimensional deep heavily doped contacts 408. In another preferred embodiment, the bottom of deep P implant region 406 is shallower than the bottom of the gate trenches. The photoresist 410 is thus removed and blanket implantation of N-type dopant, for example phosphorous or Arsenic, is carried out at the top portion of the P-body layer 414 for forming a lightly doped P layer 420 in the area other than the deep P+ contact regions 408, as shown in FIG. 4H, for forming Schottky contact at later steps. The blanket implantation of N-type dopant does not affect the P+ contact regions 408 due to its relatively low dosage.

Figure 4I:
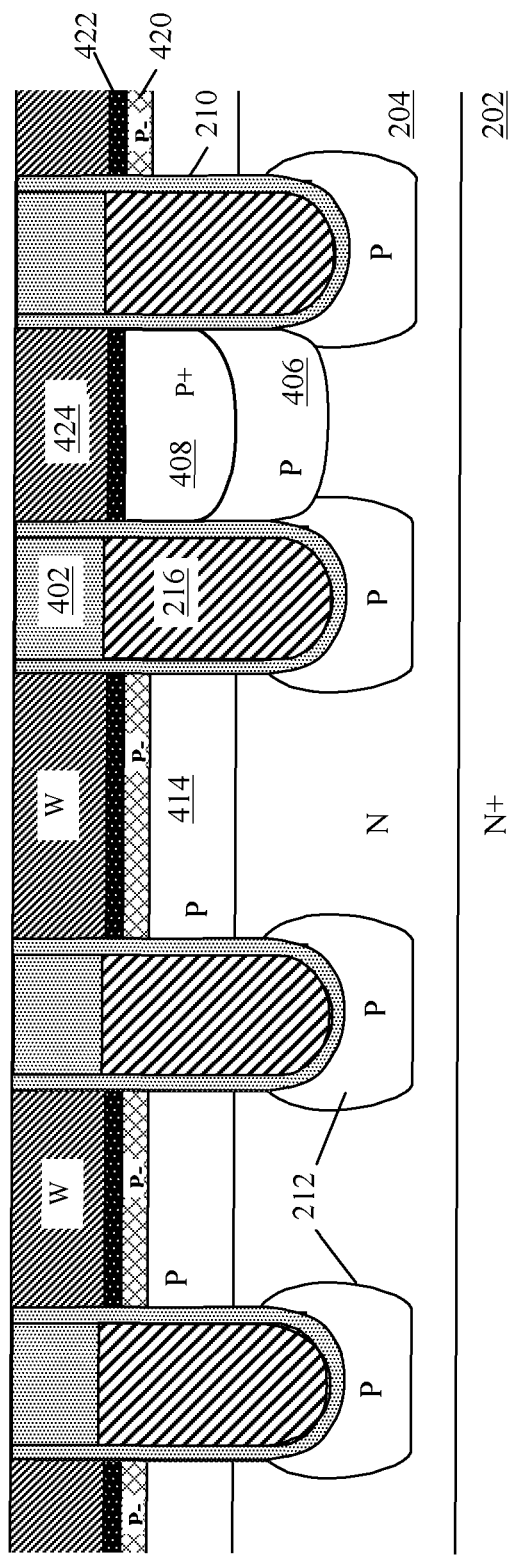

Thin oxide 404 is then removed followed by the deposition of Schottky metal as shown in FIG. 4I, which includes the deposition of a Schottky metal layer 422, preferably Ti-Silicide, forming Schottky contact between the lightly doped P-layer 420 and the Schottky metal layer 422 after temperature treatment with Schottky formed selectively on the mesa surface and the un-reacted metal is then removed. The Schottky metal layer 422 covers the entire flat mesa surface patterned with lightly doped P-regions 420 interspersed with P+ contacts 408 thus Schottky contacts are formed between the Schottky metal layer 422 and the lightly doped P-regions 420 interspersed with ohmic contacts formed between the Schottky metal layer 422 the P+ contacts 408. Then, a metal 424, such as Tungsten (W), is deposited on top of the Schottky metal layer 422 over the entire mesa and planarized to the surface of the oxide 402 filling the top of the trenches 206.

Figure 4J:
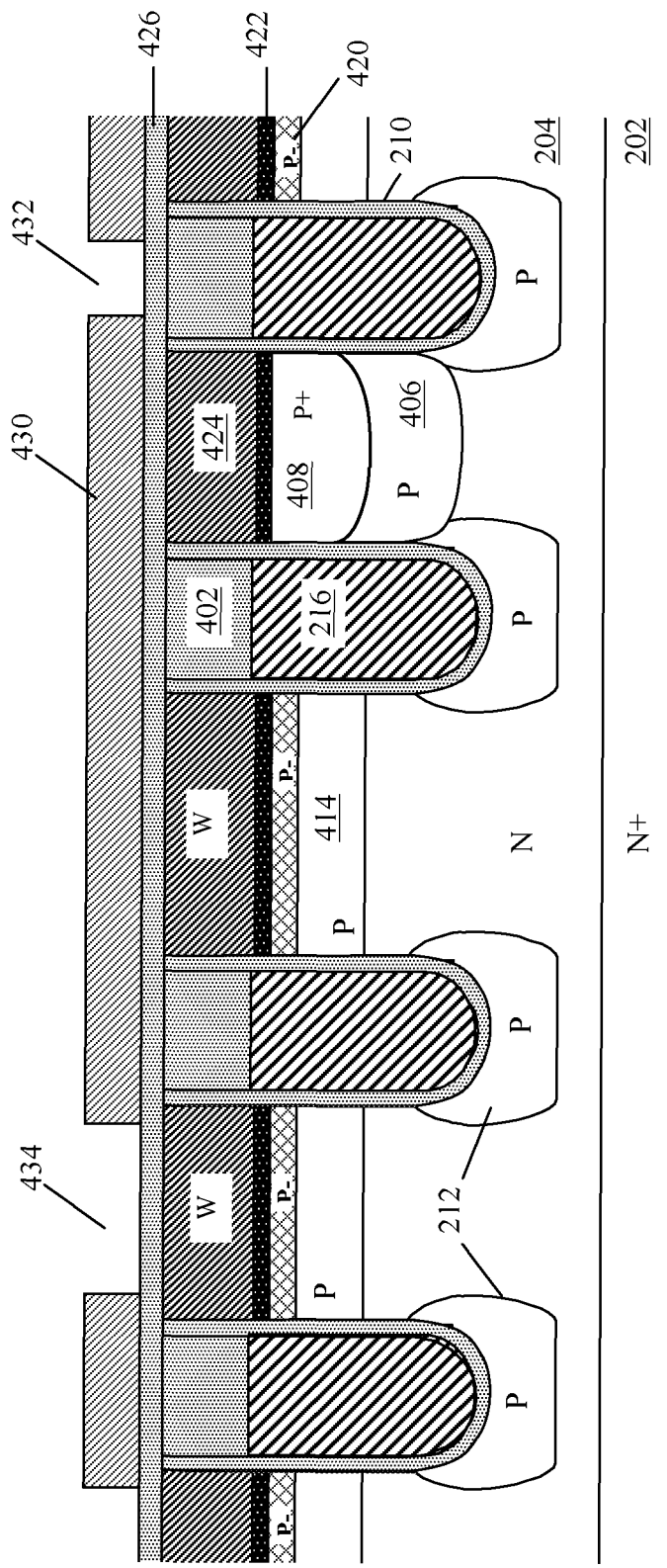
Figure 4K:
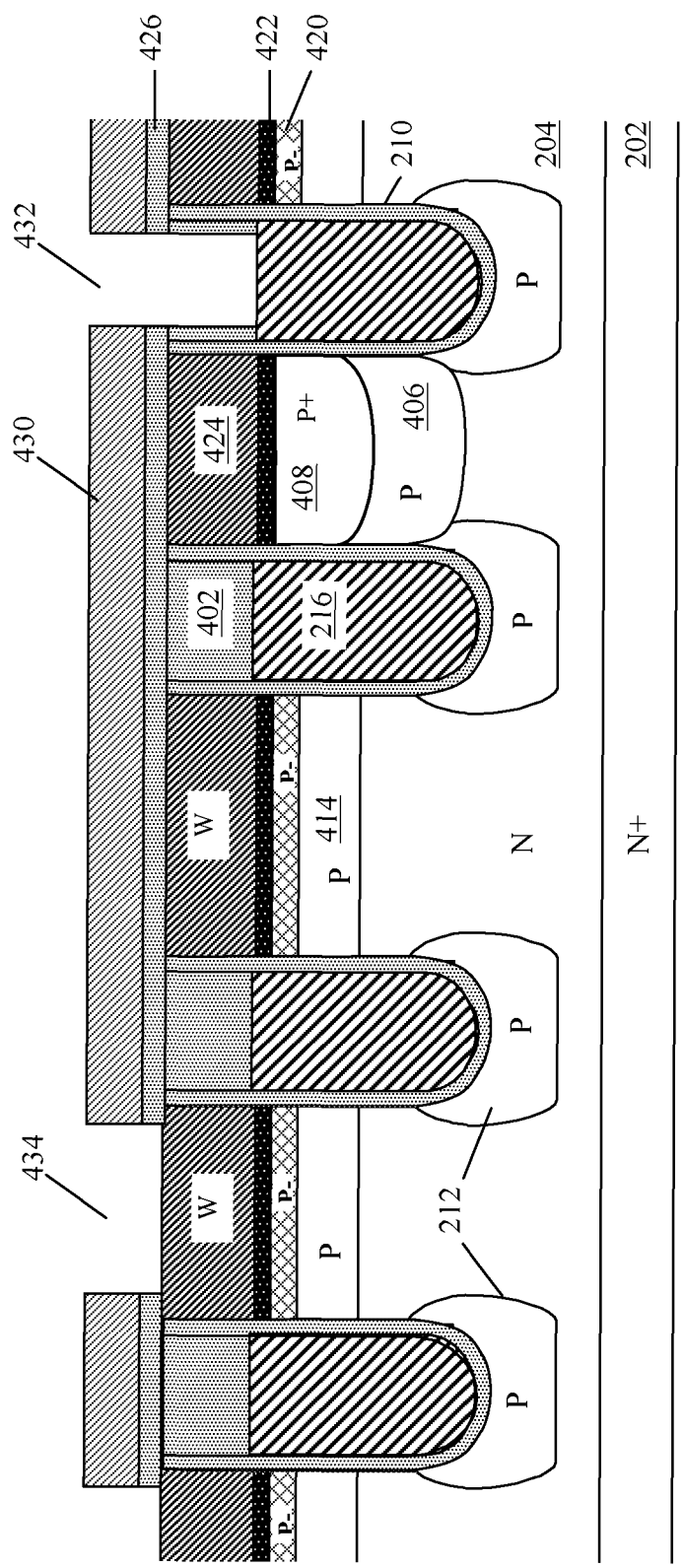
Figure 4L:
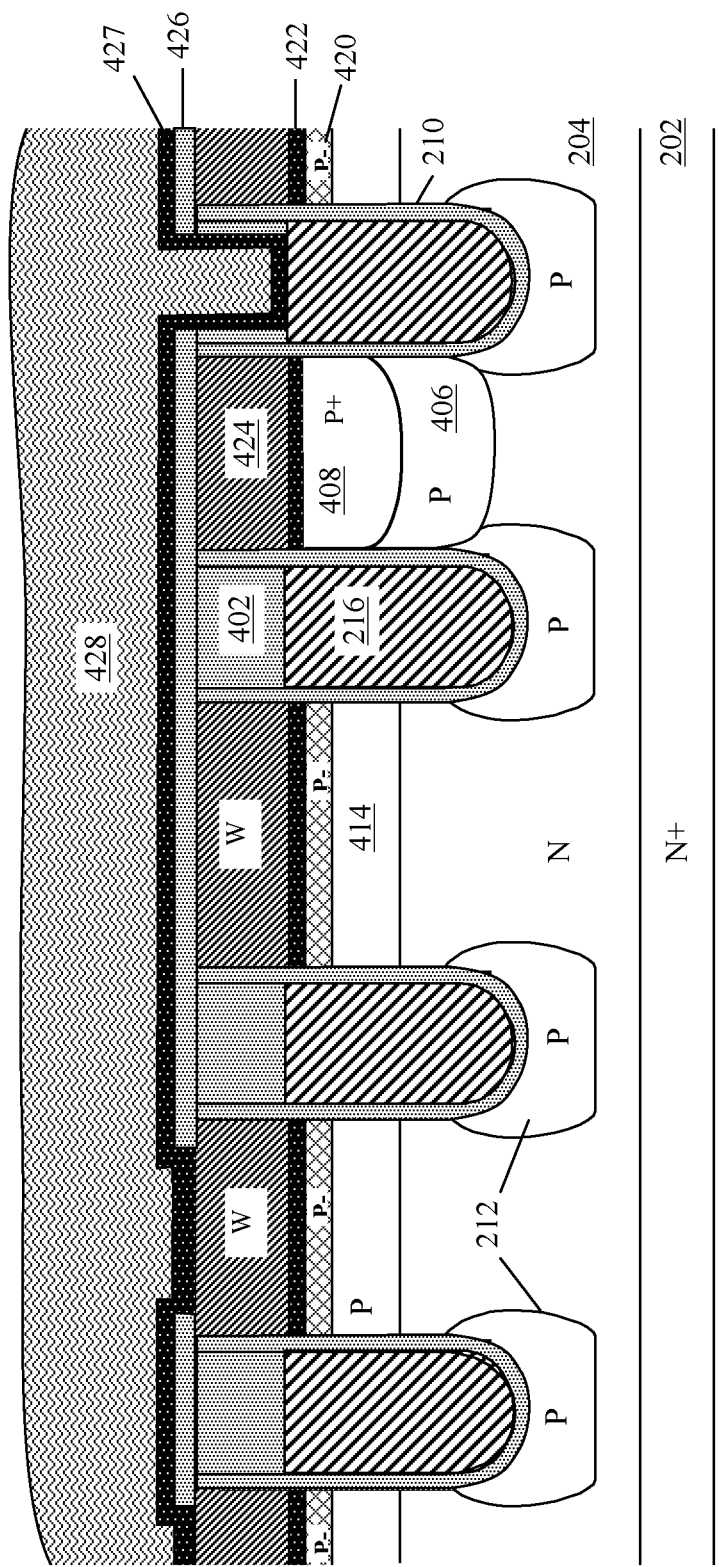

A dielectric layer 426, for example $SiO_2$, is deposited on top of the structure followed by forming a third photoresist 430, which is a contact and gate mask for the active area of the device, on the dielectric layer 426 as shown in FIG. 4J. The photoresist 430 includes openings 434 and 432 for the source and gate contacts. Thus the dielectric layer 426 and the oxide 402 are etched through the openings 434 and 432 to expose the Tungsten 424 in the silicon mesa and the polysilicon gate 216 inside the trench 206 as shown in FIG. 4K. The third photoresist 430 is then removed followed by the deposition of the barrier metal layer 427 and metal 428 as shown in FIG. 4L.

Figure 4M:
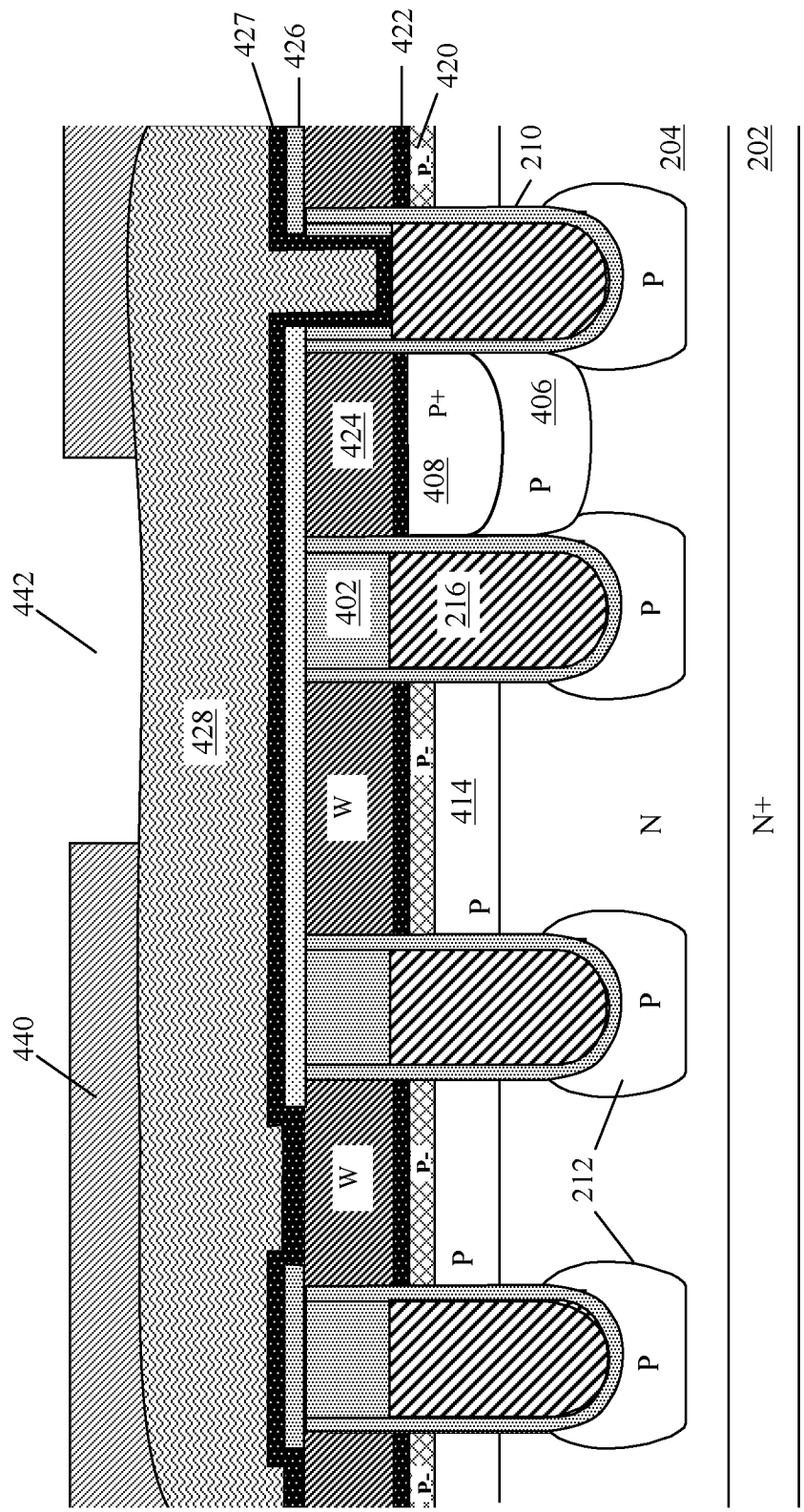
Figure 4N:
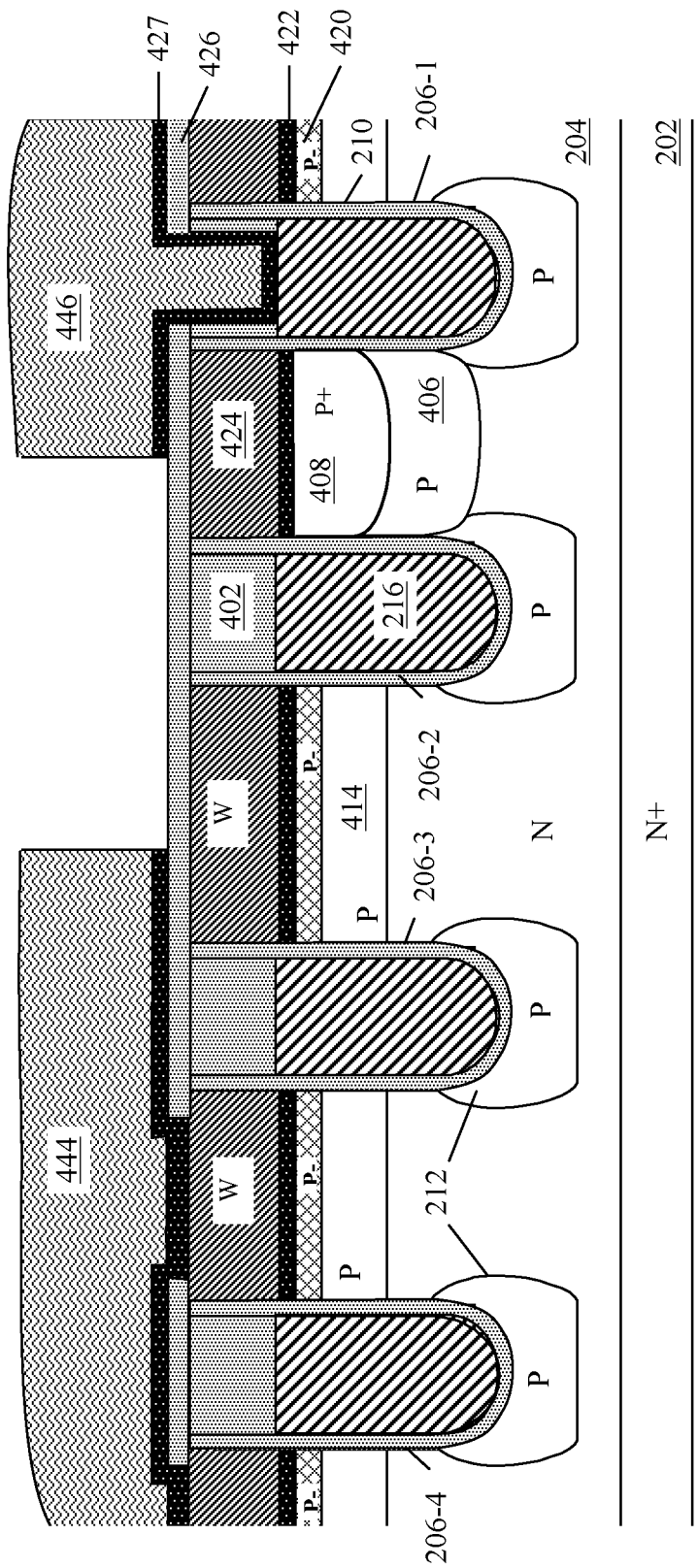

As shown in FIG. 4M, a fourth photoresist 440, which is a metal mask, is applied on top of metal 428 with an opening 442 to remove a portion of the metal layer over the oxide layer covering the dummy cell area for separation of gate metal and source metal. The metal 428 thus is etched to separate the source metal 444 from gate metal 446 as shown in FIG. 4N. By way of example, only one dummy gate trench is included under the gap between source metal 444 and gate metal 446 as shown in FIG. 4N, however, additional dummy gate trenches may be formed between gate contact trench 206-1 and active gate trench 206-3 to provide multiple dummy cells under the gap between the source metal 444 and gate metal 446. The dummy cells are covered by oxide to block source metal connection to the mesas of dummy cells. As shown in FIG. 4N, the deep P+ contact regions 408 formed in dummy cell mesas are covered by oxide layer 426. However the deep P+ contact regions 408 formed in active cell mesas in the third dimension are in electrical connection to the source metal through conductive layers 422 and 424 (not shown). Furthermore, for a requirement of forming the contact pads, passivation layer is deposited on top of the substrate and a fifth photoresist, which is a passivation mask, is applied to expose the pad areas.

In this Schottky-Source Nano MOSFET device, Schottky contact allows lower P-body dose, and the P-shield prevent P-body punch through, which enables to achieve low threshold voltage ($V_T$) for portable applications. In addition, lightly doped P-body will yield lower base-emitter voltage ($V_{BE}$) in synchronous mode that causes lower diode recovery losses.

Figure 5:
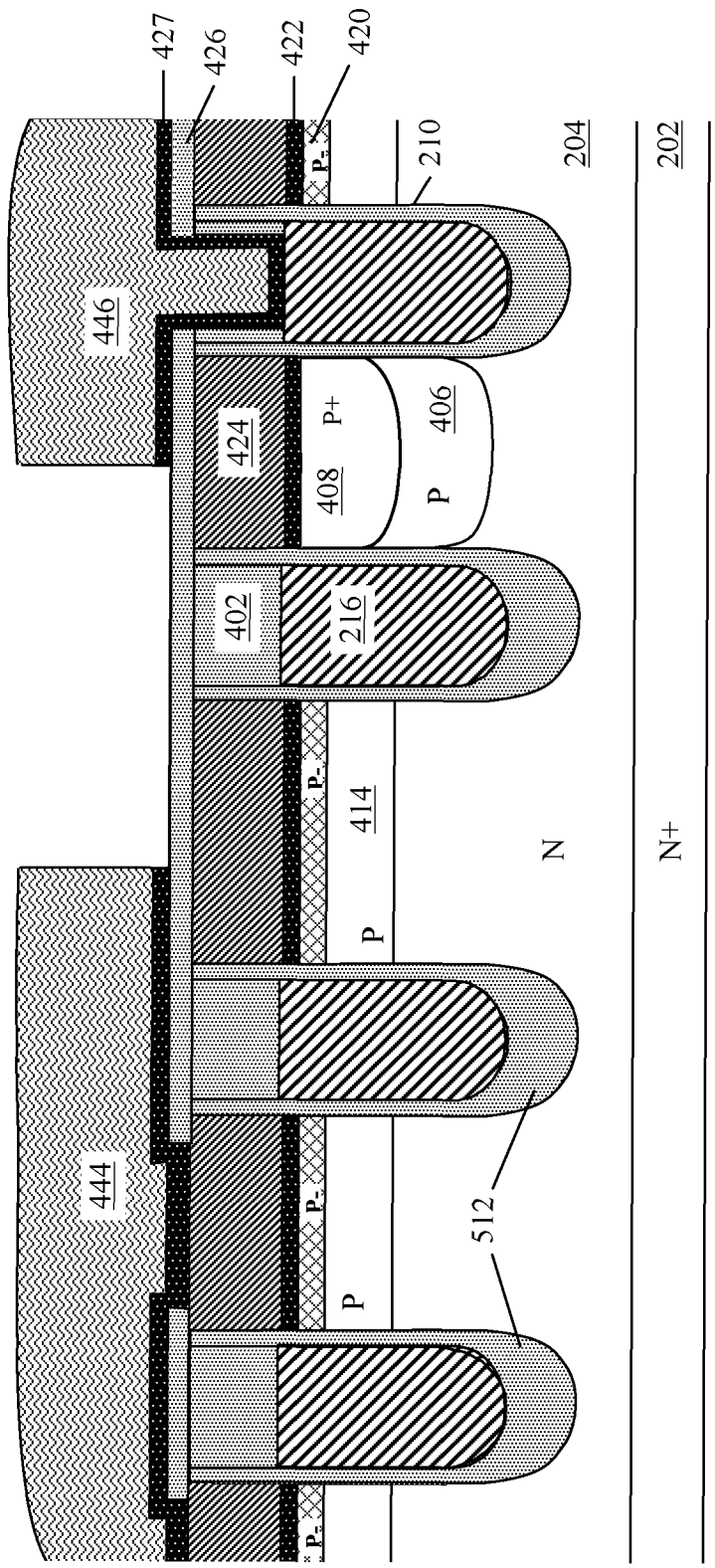
FIG. 5 is a cross-sectional view of a Schottky-Source nano-MOSFET with third dimensional deep P+ contact and thick bottom oxide (TBO) according to a fourth embodiment of the present invention.

The Schottky-Source Nano MOSFET configuration shown in FIG. 4N can be applied for Nano MOSFET with a thick bottom oxide (TBO). FIG. 5 is a cross-sectional schematic diagram illustrating a Schottky-Source Nano MOSFET device with third dimensional deep P+ contact and thick bottom oxide 512 according to a fourth embodiment of the present invention. The device structure shown in FIG. 5 is similar to the structure shown in FIG. 4N except that the deep P implant regions 212 is replaced with thick bottom oxide 512 for shielding the gate electrode 216. As such, the process of making this device is similar to the process shown in FIGS. 4A-4N with the step of P-type dopant through the trench 206 in FIG. 4B being skipped.

Figure 9:
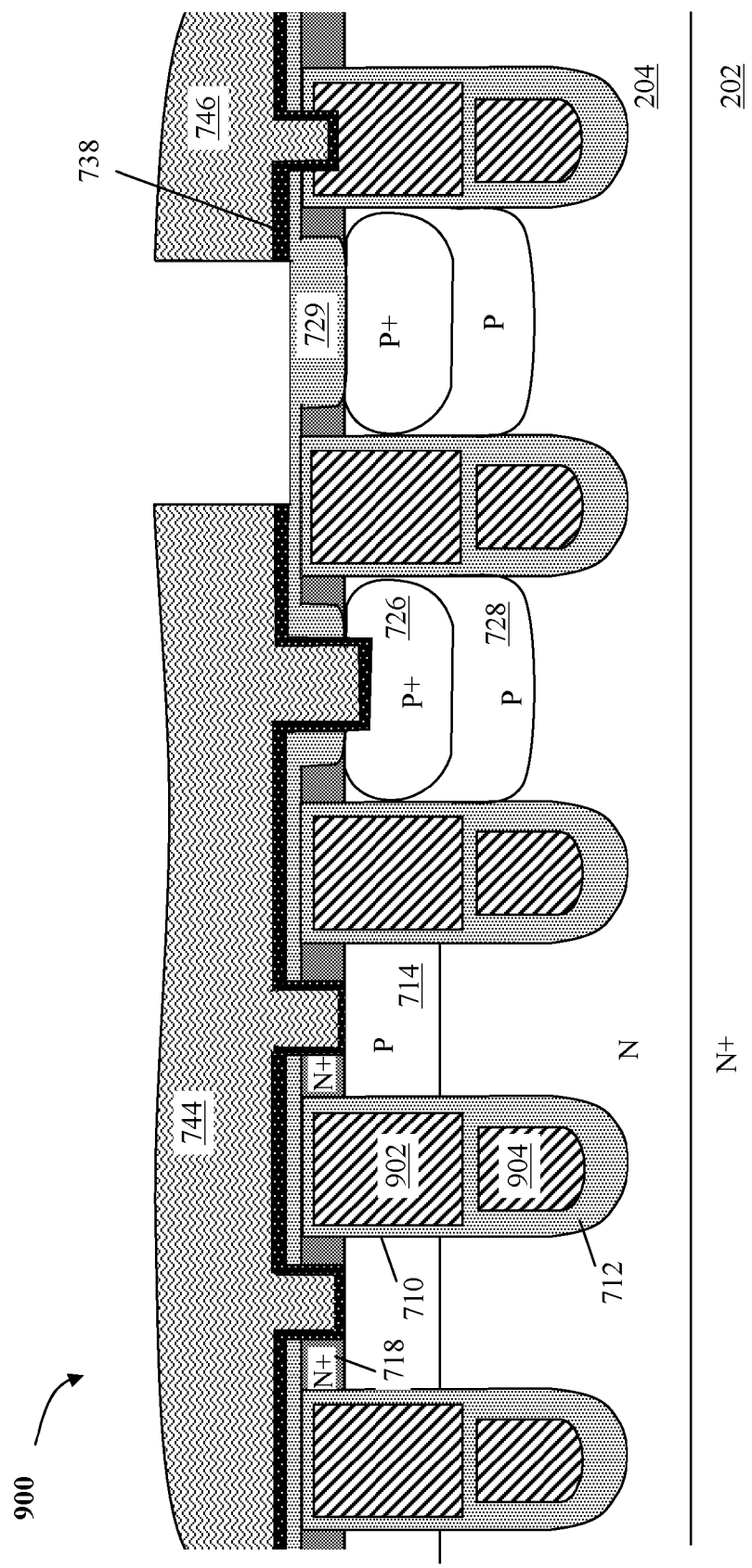
FIG. 9 is a cross-sectional view of a SGT MOSFET with third dimensional deep P+ contact and etched source region according to a sixth embodiment of the present invention.

In addition, the Schottky-Source Nano MOSFET configuration shown in FIG. 4N can also be implemented for devices having the Nano SGT MOSFET configuration with a gate structure similar to that in FIG. 9.

Figure 6:
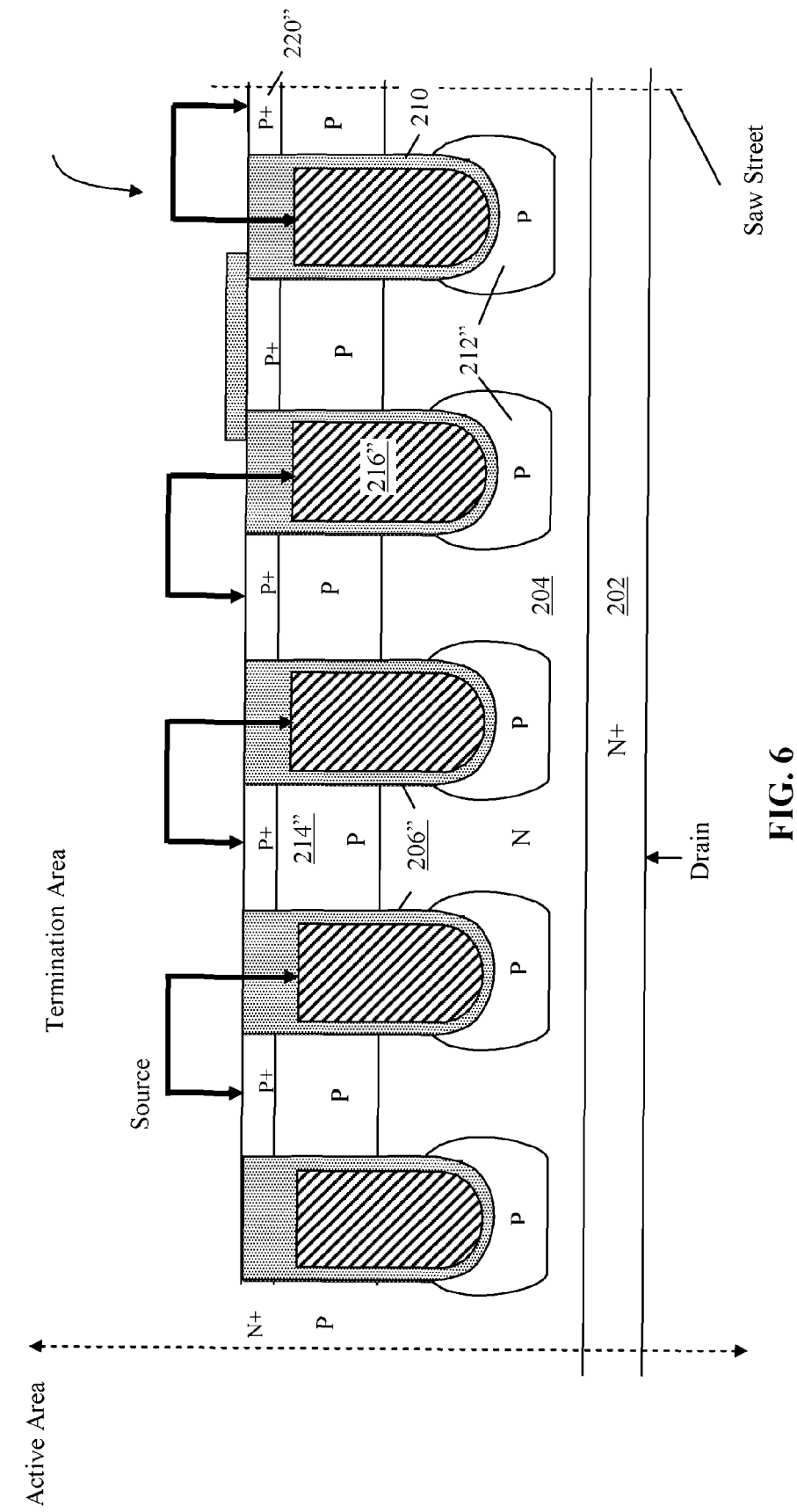
FIG. 6 is a cross-sectional view of a termination area formed with the same masks and process flow as the active area shown in FIGS. 2A-2P or FIGS. 4A-4N.

FIG. 6 is a cross-section view illustrating a termination area of the Nano MOSFET device of the type depicted in FIG. 2P, which is formed with the same masks and process as the active area as shown in FIGS. 2A-2O. As shown in FIG. 6, the termination area includes a plurality of termination gate trenches 206" formed at the same time as the gate trenches 206 in the substrate 204 through the body region 214" and lined with an insulating material 210, e.g., an oxide, with an isolated gate electrode 216" of a conductive material formed inside each trench. Unlike the active gate trenches that are interconnected, these termination gate trenches 206" are separated from each other without interconnection. Body contact P+ implant regions 220" are formed at the top portion of the body region 214" and deep P implant region 212" formed at the bottom of each trench 206". Each isolated trench gate 216" provides a trench lateral MOSFET with P+ regions 220" functioning as the source and drain of the lateral MOSFET. In the termination area, the gate electrode 216" is connected to its corresponding source electrode. By connecting the gate electrode to the source electrode, the gate electrodes 216" act as a chain in the termination area in a cascade fashion. The last isolated trench gate next to the saw street of the edge of semiconductor substrate is connected to its corresponding drain electrode to provide a channel stop. Shield implant regions 212" may be provided at the same time as shield implant regions 212 are formed. However no deep P+ third dimensional contacts 234 or deep P implant regions 232 are provided in termination region therefore the shield implant regions 212" are floating. The termination configuration shown in FIG. 6 can also implemented for Nano MOSFET devices of the types depicted in FIGS. 3A, 4N, 5 and also for the Nano SGT MOSFET devices to be described in the rest of this application with or without the floating shield implant regions 212".

Figure 7:
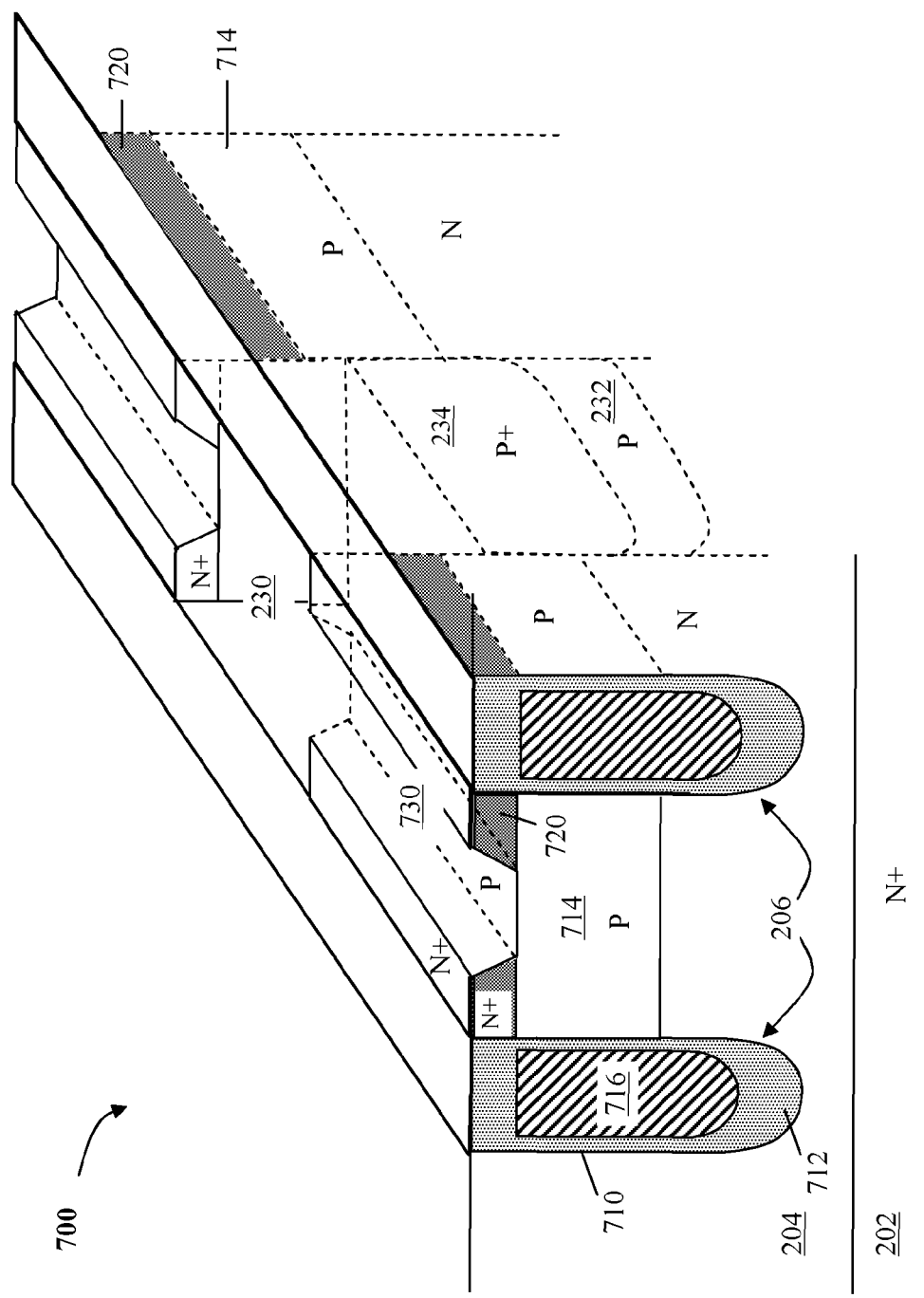
FIG. 7 is a three dimensional view of a nano-MOSFET with third dimensional deep P+ contact, etched source region and thick bottom oxide (TBO) according to a fifth embodiment of the present invention.

FIG. 7 is a three-dimensional view of a nano-MOSFET device 700 with third dimensional deep P+ contact, N+ source region and thick bottom oxide according to a fifth embodiment of the present invention. Similar to the device 100 or 300, the device 700 is formed on a semiconductor substrate 204 of the first type dopant, for example N-type, a lower portion 202 of which is heavily doped with the first type to act as a drain. A body region 714 doped of a second type opposite to the first type, for example P-type, is formed near a surface of the substrate 204. A source region 720 is formed in the body region 714 at or near the surface of the substrate. The source region 720 is doped opposite the body region 714, but more heavily than the drain region.

Gate trenches 206 are formed in the substrate through the body region. The trenches 206 are lined with an insulating material 710, e.g., an oxide, with a gate electrode 716 of a conductive material formed inside each trench. Thick bottom oxide 712 is formed inside and at the bottom of each trench 206 underneath the gate electrode 716 for shielding the gate electrode 716. The device 700 also includes a third dimensional deep P+ contact including a P+ contact region 234 above a P implant region 232 formed in a third dimension through the opening 230 in the mesa between two gate trenches 206. In this embodiment, an elongated opening 730 is formed across a center portion of the source region in the mesa between two active gate trenches along the third dimension. The elongated opening 730 also runs across the opening 230. In one embodiment the elongated opening 730 penetrates through a depth of the source region 720 exposing a top portion of the body 714 in the center of the mesa. In another embodiment the opening 230 is etched into the body region 714 deeper than the elongated opening 730. A metal (not shown in FIG. 7) filling the elongated opening 730 and the opening 230 provides an active cell contact and electrical contact with the deep P+ contacts. For high density compact cell devices with pitch less than 1 um, such as the nano-MOSFET disclosed in this invention, P+ contact implant at the bottom of the elongated opening 730 is avoided to prevent interference to the gate threshold. Alternatively the thick bottom oxide gate trench may be replaced with a uniform gate oxide trench with a shield implant region surrounding the bottom of gate trench as that shown in FIG. 1A with a deep implant electrically connecting the shield implant region to the source electrode through the third dimensional contact.

Figure 8A:
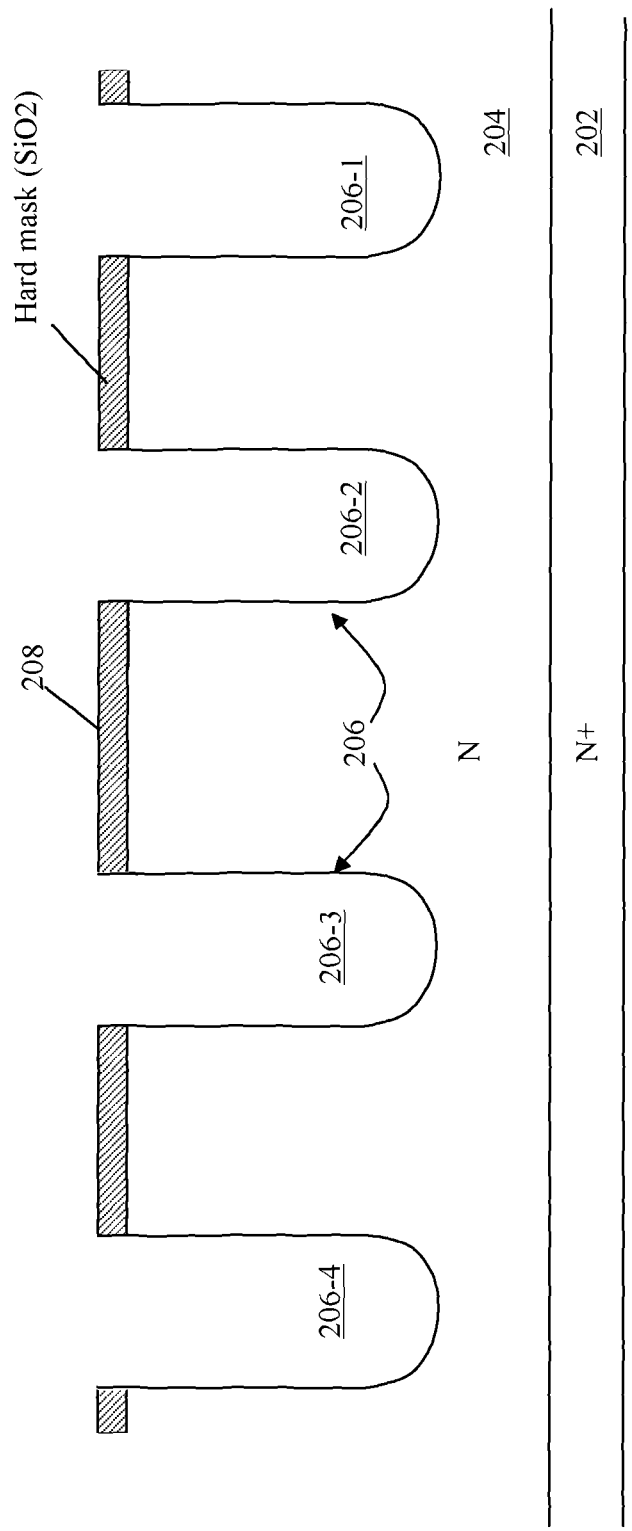
FIGS. 8A-8J are a sequence of cross-sectional schematic diagrams illustrating a method of fabrication the nano-MOSFET with third dimensional deep P+ contact, etched source region and thick bottom oxide (TBO) of the type depicted in FIG. 7.
Figure 8B:
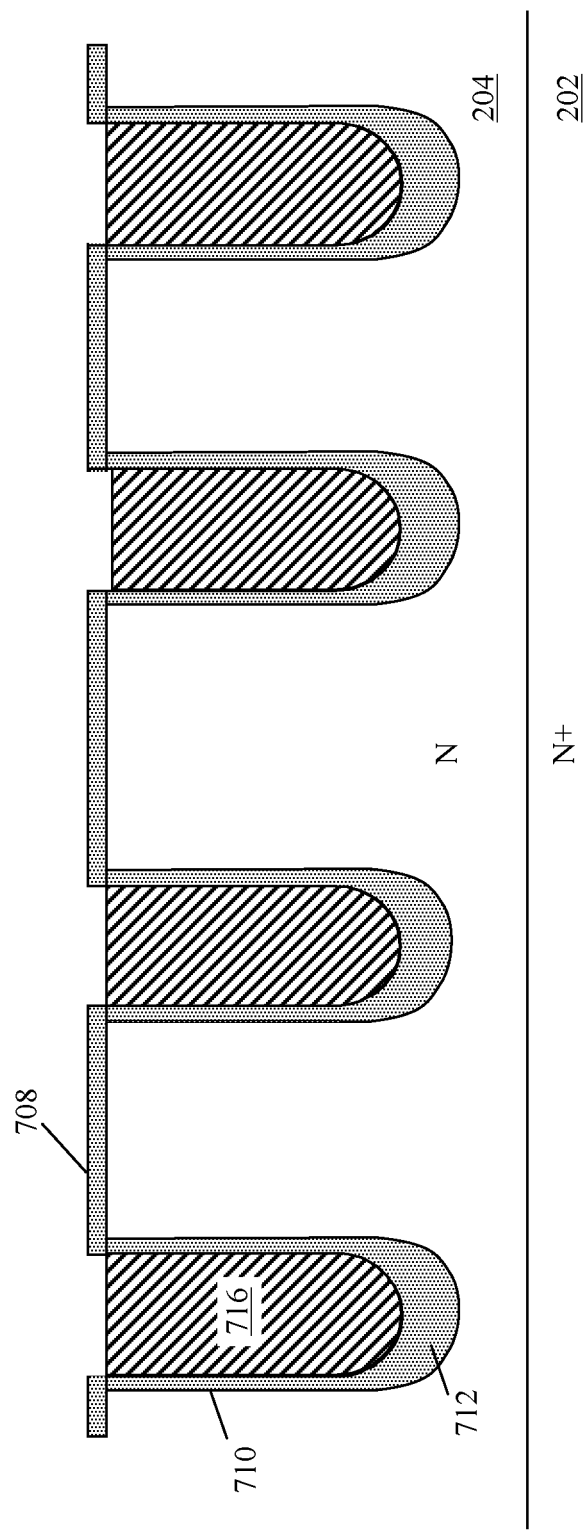
Figure 8C:
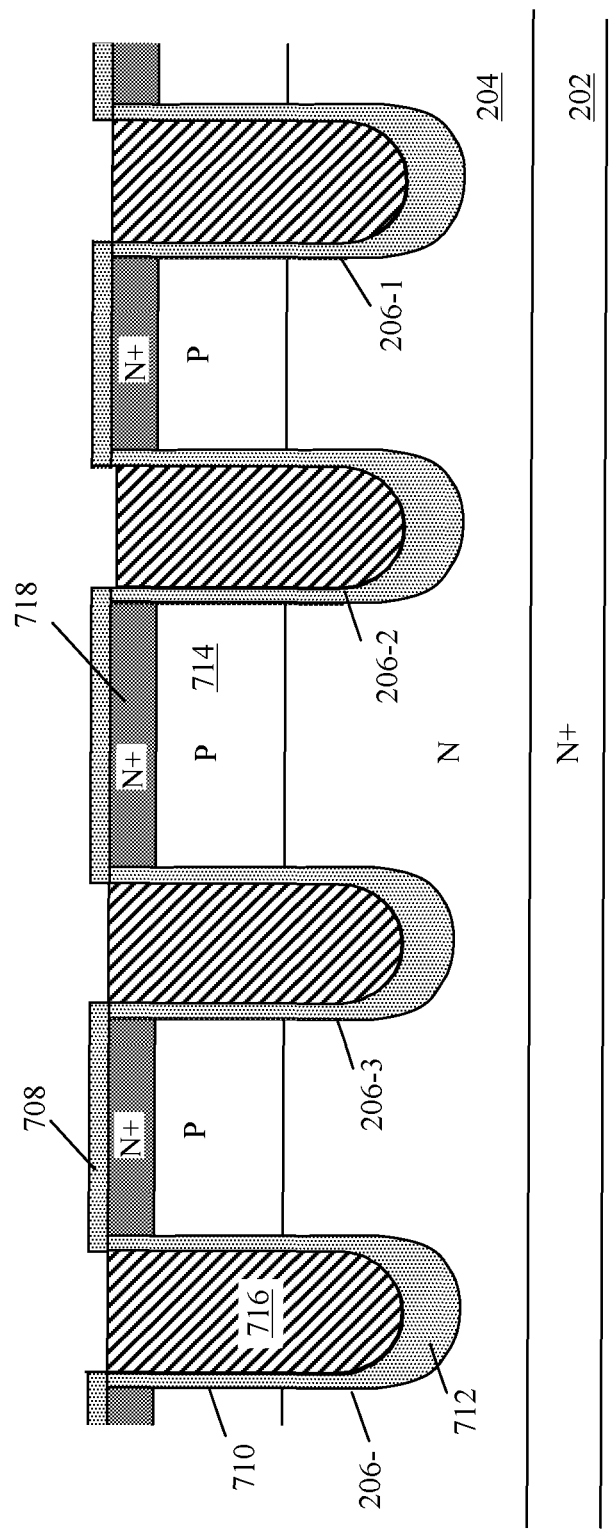

FIGS. 8A-8K are cross-sectional diagrams illustrating a process of making the nano-MOSFET device shown in FIG. 7. As seen in FIG. 8A, the process may begin by forming an initial layer of insulator, e.g., oxide 208, on the N-type semiconductor substrate 204, a lower portion 202 of which is heavily doped with the N-dopant to act as a drain. A first photoresist (not shown), which is a trench mask, may be formed on the oxide 208 and then developed followed by patterning the oxide 208 to form the openings in the oxide 208. The trench mask is removed and gate trenches 206, including gate contact trench 206-1, dummy gate trench 206-2, active gate trenches 206-3 and 206-4 which are all interconnected in a third dimension, may then be etched in the semiconductor substrate 204 through the openings in the oxide 208. As shown in FIG. 8B, the oxide 208 is removed followed by forming a thin oxide 708 on the surface of the substrate 204, which includes openings on the trenches 206. A thick bottom oxide 712 is formed at the bottom of the trenches and a thin gate oxide 710, which is about 50 A° to 500 A° for a low voltage device, is then grown on the sidewall of the trenches. Conductive material 716, such as polysilicon with heavily doped N-type, is thus deposited to fill the trench 206. Polysilicon 716 and thin oxide 708 are etched back to the top surface of the substrate 204, thus oxide 708 is grown back. As shown in FIG. 8C, P-type implantation, with a dose of 5e12 cm$^{-2}$ to 1e14 cm$^{-2}$ and at an energy of 30 keV to 100 keV, is carried out on the top portion of the substrate 204 in the mesa between two adjacent trenches 206 followed by a drive process to form P-body region 714. Then, an N-type implantation at a high does and low energy is carried out to form N+ source region 718 that extends across the width of a space between adjacent trenches 206.

Figure 8D:
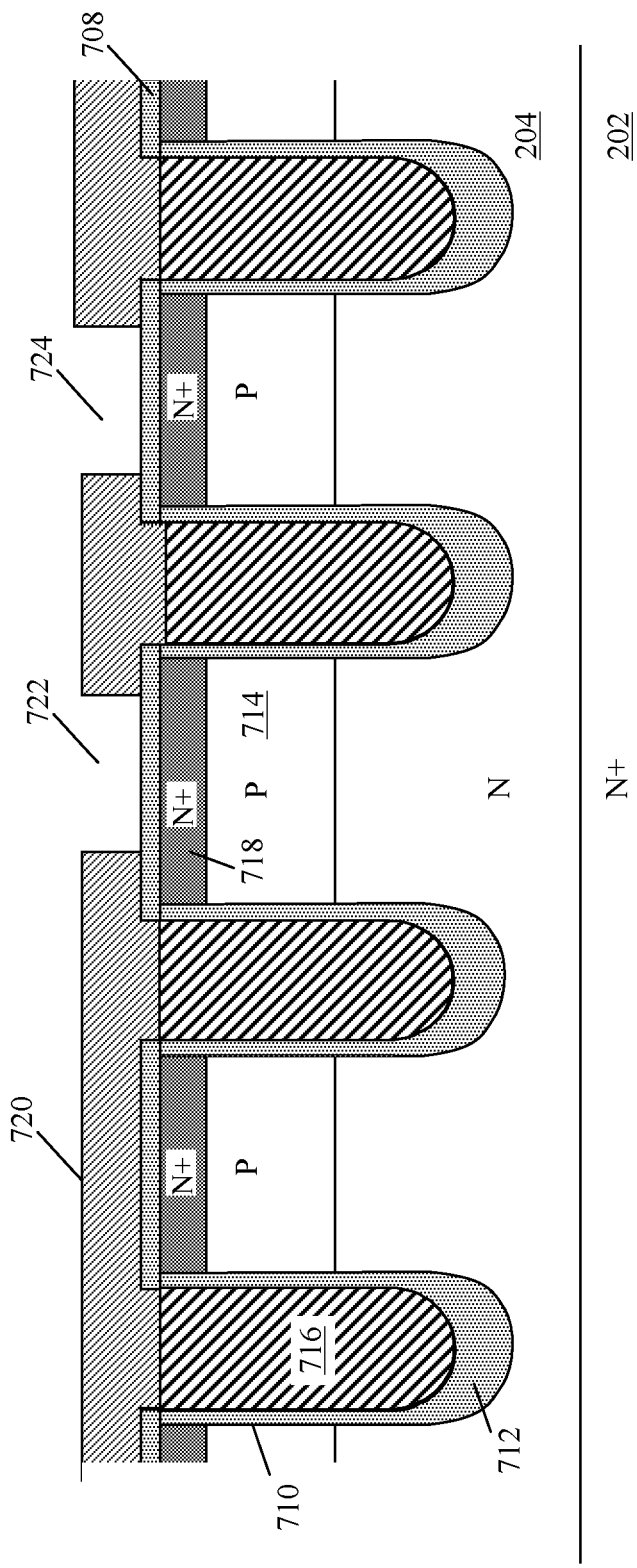
Figure 8E:
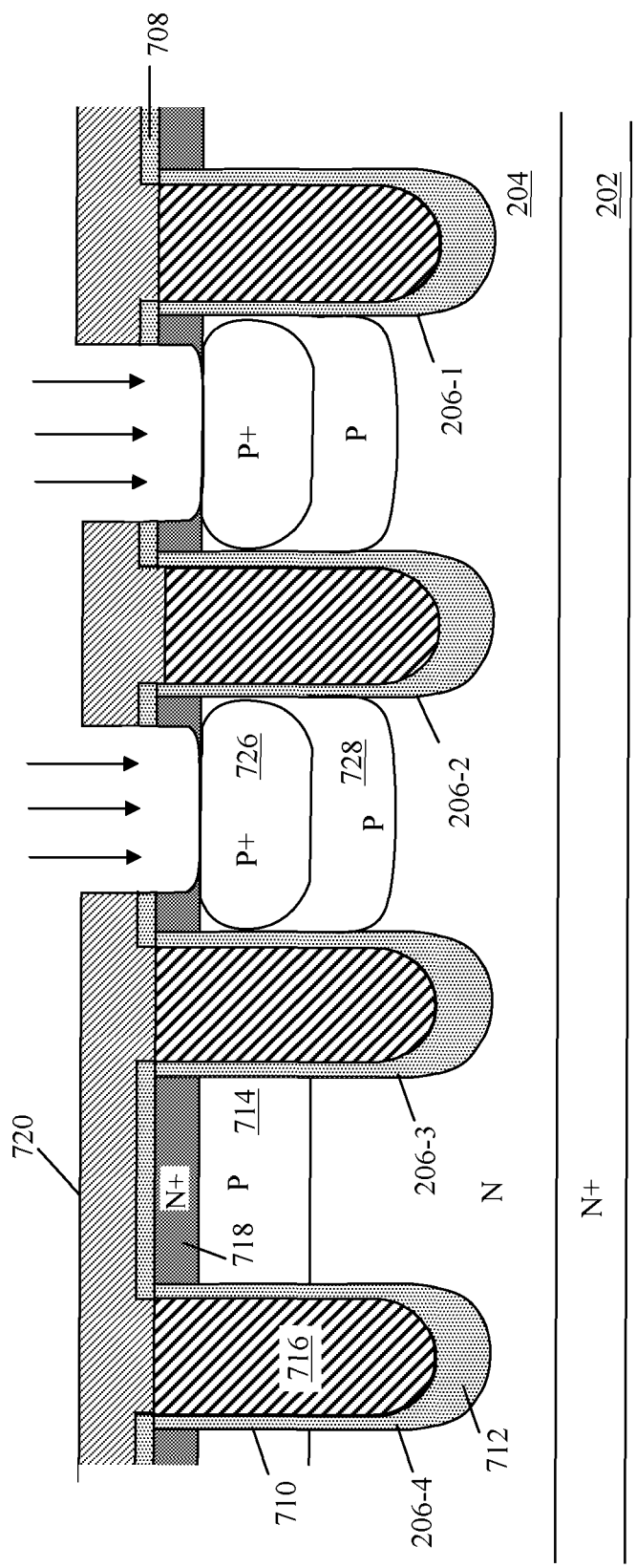
Figure 8F:
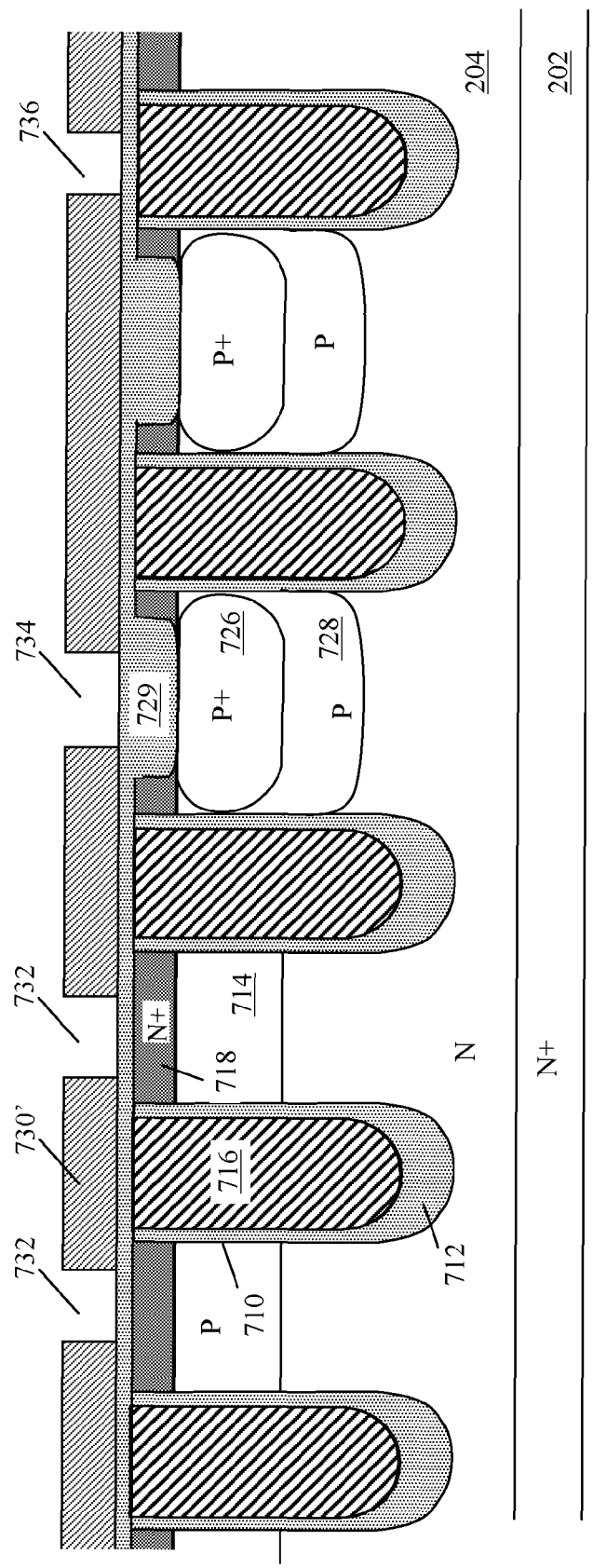
Figure 8G:
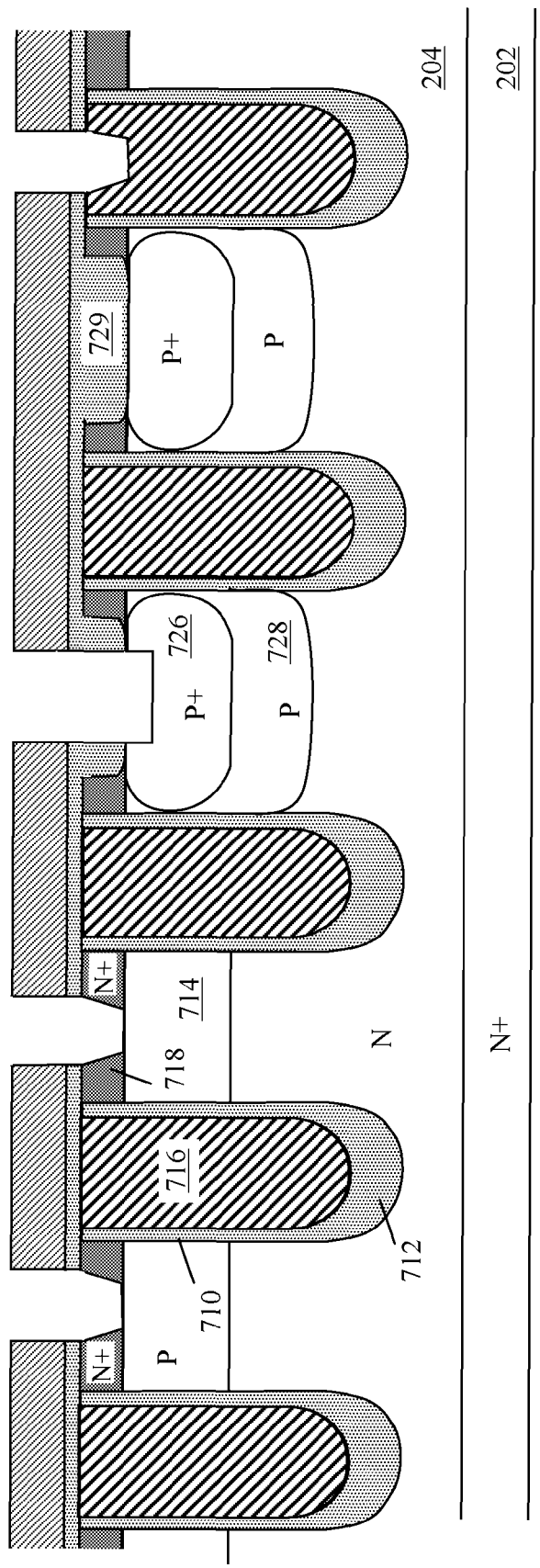

A second photoresist 720, which is a P+ contact mask, is formed on top of the substrate and then developed to form the openings 722 and 724 in the selective mesa between two adjacent gate trenches 206 as shown in FIG. 8D. The thin oxide 708 and the N+ source region 718 are etched through the openings 722, 724. Preferably, the N+ source region 718 is etched off 0.1 µm to 0.2 µm depth. In one embodiment the width of openings 722 and 724 are narrower than the width of mesas leaving residual N+ regions along the side walls of the gate trenches. In another embodiment the width of openings 722 and 724 are across the entire width of mesas. Deep P-type implantation, preferably BF2 or Boron, with high does and high energy is carried out to form an optional deep P-implant region 728 and a P+ contact region 726 atop the optional P-implant region 728 as shown in FIG. 8E. Alternatively the photoresist 720 may also includes a plurality of openings 230 as shown in FIG. 7 layout periodically along the length of each semiconductor mesa between two adjacent gate trenches, including the dummy gate trenches and the gate contact trench, and each opening extends across the entire width of the semiconductor mesa. Sections of source region 718 under openings 230 are etched through at least down to the body region 714 followed with the deep P+ contact implant 234 and the optional deep P region implant 232. The openings disposed on adjacent mesas are preferably interleaved with each other. For simplicity only one such opening is shown in FIG. 7 between two active gate trenches. As shown in FIG. 8F, a photoresist 720 is removed. A dielectric layer 729, e.g. an oxide, is deposited to fill the etched N+ source region and thus is planarized, including the openings 230 which are not shown here. A third photoresist 730, which is a contact mask, is applied on top of the substrate and then developed to form the opening 732 for forming the active cell contact, opening 734 for deep P+ contact and opening 736 for forming a gate contact. The oxide 729 is etched followed by the etching of N+ source region through the opening 732, the etching of P+ region 726 through the opening 734 and the etching of polysilicon 716 through the opening 736 to a depth of about 0.1 µm to 0.2 µm as shown in FIG. 8G. As shown in FIG. 7, the active cell contact opening is opened along the length and in the middle of the mesa down to a depth at least through the source layer 720 to expose a central top portion of the body region. The openings 230 filled with dielectric 729 in step shown in FIG. 8F are now reopened (not shown).

Figure 8H:
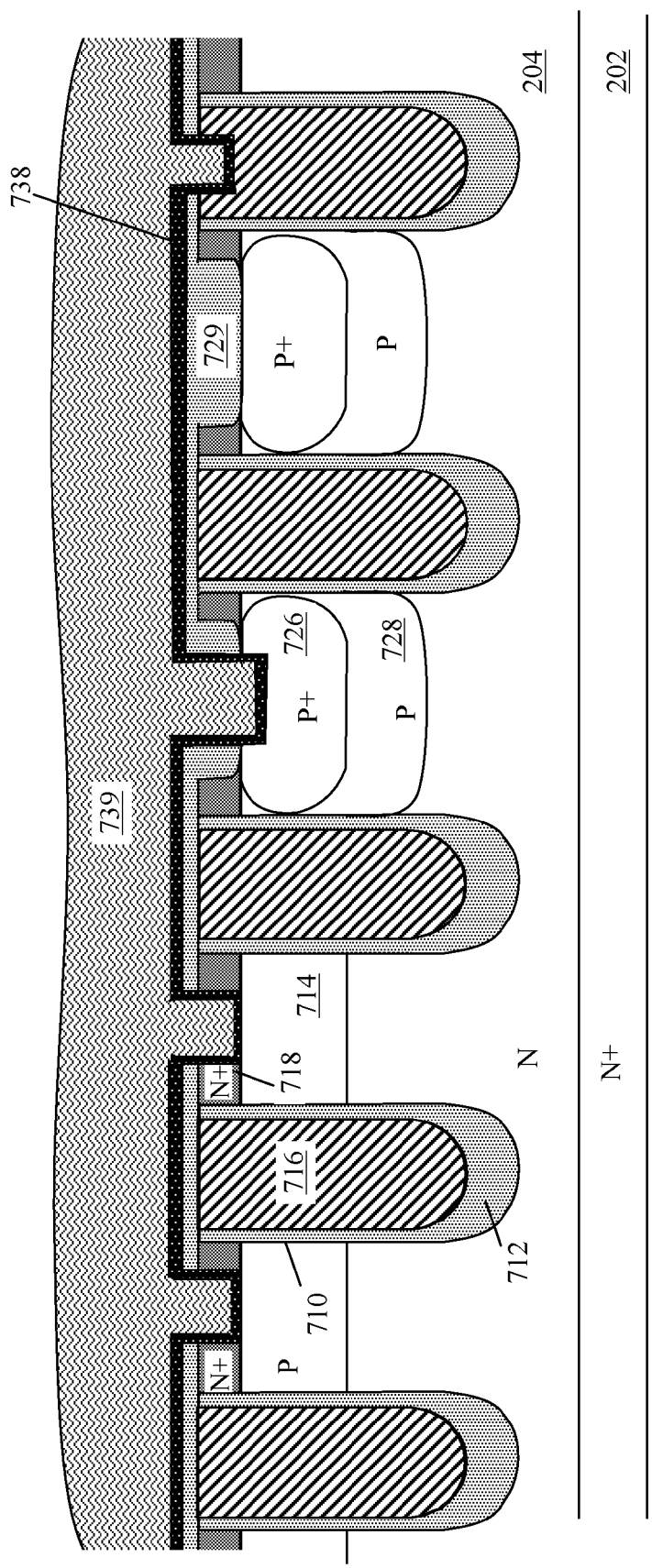
Figure 8I:
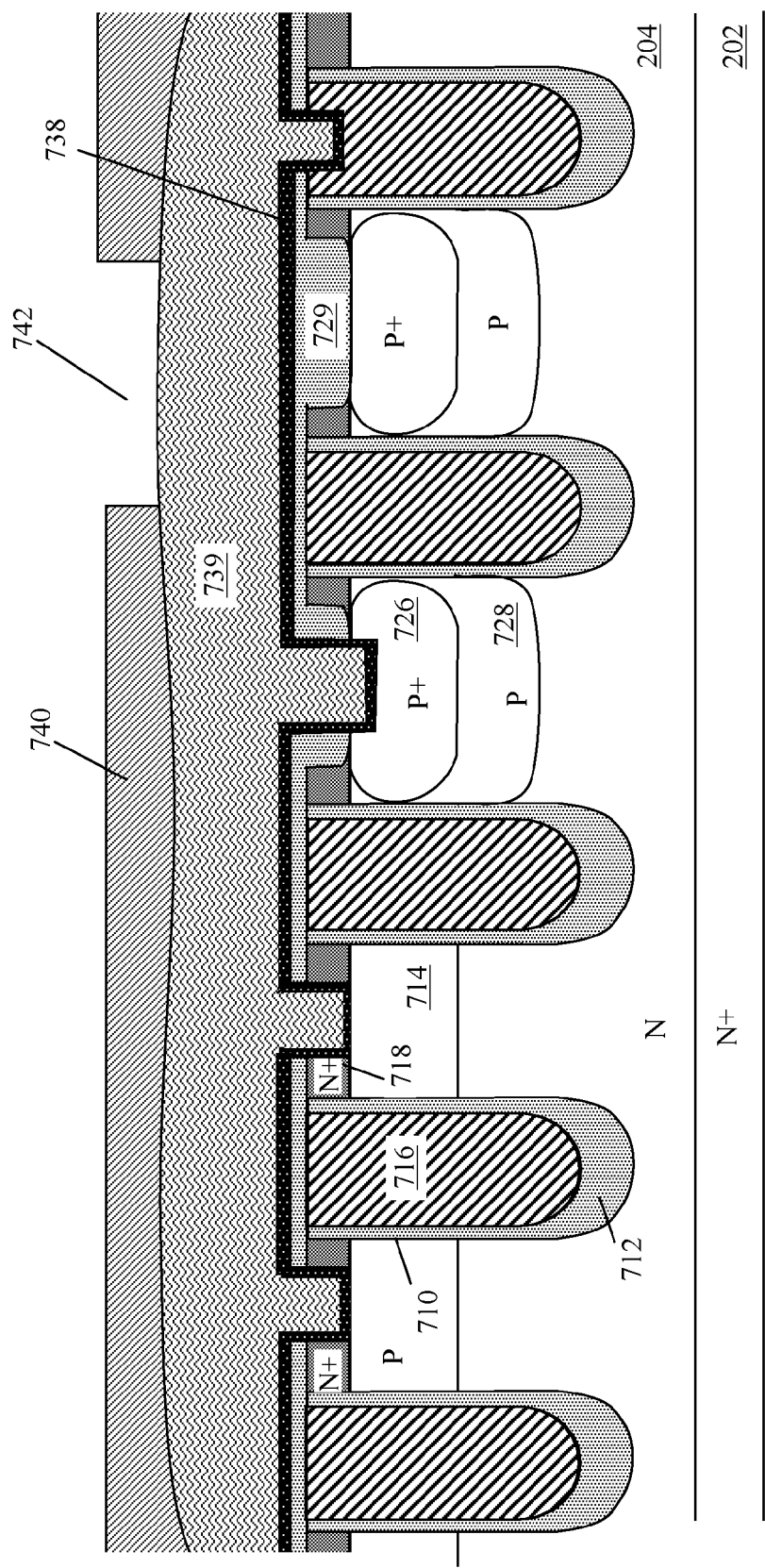
Figure 8J:
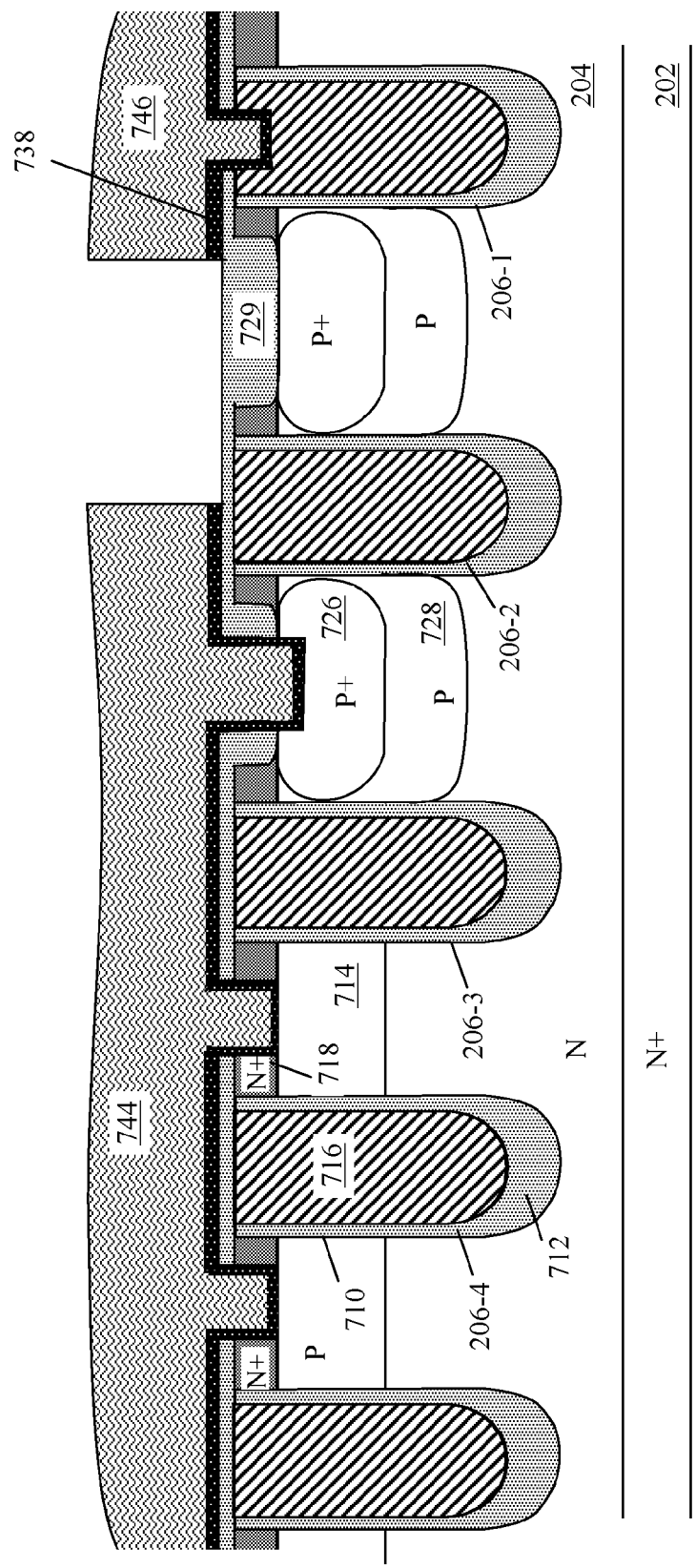

As shown in FIG. 8H, the photoresist 730' is removed. Thin barrier layer 738 of Ti/TiN is formed on top of the substrate followed by the deposition of a metal 739, such as Aluminum, over the whole substrate. The opening 734 may be narrower than the opening 722 such that conductive layers 738 and 739 filing the opening 734 would be separated by the residue of dielectric material filling the opening 722, from the source region on the mesa between the dummy gate trench 206-2 and the active gate trenches 206-3. A fourth photoresist 740, which is a metal mask, is applied on top of metal 739 with an opening 742 for separation of gate metal and source metal as shown in FIG. 8I. The metal 739 thus is etched to separate the source metal 744 from gate metal 746 as shown in FIG. 8J. Furthermore, for a requirement of forming the contact pads, passivation layer is deposited on top of the substrate and a fifth photoresist, which is a passivation mask, is applied to expose the pad areas.

The nano-MOSFET with third dimensional P+ contact configuration shown in FIG. 7 and FIG. 8J is also applied for a shield gate trench (SGT) nano-MOSFET. FIG. 9 is a cross-sectional schematic diagram illustrating a SGT nano-MOSFET device with third dimensional deep P+ contact, N+ source region and thick bottom oxide. The structure of the SGT nano-MOSFET device 900 is similar to the structure of the nano-MOSFET device of FIG. 8J except that a gate electrode 902 and a shield electrode 904 are formed inside the trench 206 instead of just a gate electrode 716. Furthermore, the thick bottom oxide 712 of the nano-MOSFET device shown in FIG. 7 or FIG. 8J can be replaced with P shield regions, for example P shield regions 212 of FIG. 2P, at the bottom of the trenches 206, in this case the implant of deep P-implant region 728 is mandatory for the electrical connection of the P shield regions 212 to the source metal.

The description above uses N-channel MOSFET as embodiments and is applicable to P-channel MOSFET by reversing the conductivity types of each doping region. While the above is a complete description of the preferred embodiments of the present invention, it is possible to use various alternatives, modifications, and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A" or "An" refers to a quantity of one or more of the item following the article, except where expressly stated otherwise. The appended claims are not to be interpreted as including means-plus-function limitations, unless such a limitation is explicitly recited in a given claim using the phrase "means for". Any element in a claim that does not explicitly state "means for" performing a specified function, is not to be interpreted as a "means" or "step" clause as specified in 35 USC §112, ¶6.

What is claimed is:

1. A semiconductor power device, comprising:
a lightly doped layer of a first conductivity type formed on top of a heavily doped layer of the first conductivity type;
a body region of a second conductivity type opposite the first conductivity type formed at an upper portion of the lightly doped layer of the first conductivity type;
a body contact region of the second conductivity type formed at an upper portion of the body region, wherein the body contact region is more heavily doped than the body region; and
one or more field effect transistor devices, each of said one or more field effect transistor devices including first and second electrically insulated gate electrodes formed in corresponding first and second trenches in the lightly doped layer and a source region of the first conductivity type extending between a sidewall of the first trench and a sidewall of the second trench, wherein each of the first and second trenches has a depth that extends in a first dimension, a width that extends in a second dimension and a length that extends in a third dimension, wherein the first dimension is perpendicular to a plane of the heavily doped layer and wherein the second and third dimensions are parallel to the plane of the heavily doped layer,
wherein a portion of the body region extends between the first and second trenches proximate an upper surface of the lightly doped layer;
wherein the source region of the first conductivity type includes an upper portion formed proximate the upper surface and adjacent between the first and second trenches extending along the third dimension and first and second deeper portions extending partly along the sidewalls of the first and second trenches in the first direction below the upper portion, wherein the first and second deeper portions extend in the first dimension to a depth below the bottom of the body contact region, and wherein a portion of the body contact between the first and second trenches is separated from the sidewalls of the first and second trenches by the first and second deeper portions of the source region; and
a termination area having one or more isolated termination electrodes disposed in one or more corresponding trenches formed through the body contact region and body region into the lightly doped layer of the first conductivity type and doped implant shield regions formed in the lightly doped layer of the first conductivity type adjacent bottom portions of the one or more isolated trenches extending along the third dimension, wherein each isolated termination electrode functions as a gate of a lateral MOSFET with portions of the body region between adjacent corresponding trenches functioning as a source and drain of the lateral MOSFET.

2. The device of claim 1, wherein the source region further comprises a first and second lightly doped regions of the first conductivity type disposed below and intersecting with the first and second deeper portions of the source region, respectively, wherein the first and second lightly doped regions are less heavily doped than the upper portion and first and second deeper portions of the source region.

3. The device of claim 1 wherein each of the one or more field effect transistor devices further includes an opening formed between the first and second trenches through the upper portion of the source region and the heavily doped contact of the second conductivity type to the body region and a conductive material in the opening forming an electrical contact with a source metal that is in electrical contact with the source region.

4. The device of claim 3, further comprising a deep contact region formed in the body region below the opening and a deep implant region of the second conductivity type formed in the lightly doped layer of a first conductivity type below and in electrical contact with the deep contact region, wherein the deep contact region is more heavily doped than the deep implant region.

5. The device of claim 1 further comprising, first and second deep shield implant regions of the second conductivity type formed in the lightly doped layer of a first conductivity type proximate the bottom of the first trench and the bottom of the second trench, respectively.

6. The device of claim 1, wherein each of the one or more field effect transistor devices includes a thick bottom insulator formed inside and at the bottom of the first trench and the second trench, under the first gate electrode and second gate electrode.

7. The device of claim 1, further comprising a gate contact trench formed in the lightly doped layer in communication with the first and second gate trenches, a conductive material in the gate contact trench electrically isolated from sidewalls of the gate contact trench by an insulating material, the conductive material being in electrical contact with the first and second gate electrodes and with a gate metal.

8. The device of claim 1, wherein one or more of the termination electrodes is connected to its corresponding source.

9. The device of claim 8, wherein a last isolated termination electrode is connected to its corresponding drain electrode to provide a channel stop.

\* \* \* \* \*